(12) United States Patent
Akutsu et al.

(10) Patent No.: US 11,922,018 B2
(45) Date of Patent: Mar. 5, 2024

(54) STORAGE SYSTEM AND STORAGE CONTROL METHOD INCLUDING DIMENSION SETTING INFORMATION REPRESENTING ATTRIBUTE FOR EACH OF DATA DIMENSIONS OF MULTIDIMENSIONAL DATASET

(71) Applicant: HITACHI, LTD., Tokyo (JP)

(72) Inventors: Hiroaki Akutsu, Tokyo (JP); Takahiro Naruko, Tokyo (JP); Akifumi Suzuki, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 63 days.

(21) Appl. No.: 17/761,782

(22) PCT Filed: Dec. 18, 2020

(86) PCT No.: PCT/JP2020/047314
§ 371 (c)(1),
(2) Date: Mar. 18, 2022

(87) PCT Pub. No.: WO2021/140867
PCT Pub. Date: Jul. 15, 2021

(65) Prior Publication Data
US 2022/0382459 A1    Dec. 1, 2022

(30) Foreign Application Priority Data
Jan. 10, 2020    (JP) .................................. 2020-002919

(51) Int. Cl.
G06F 3/06    (2006.01)
G06N 3/08    (2023.01)
H03M 7/30    (2006.01)

(52) U.S. Cl.
CPC .......... *G06F 3/0608* (2013.01); *G06F 3/0659* (2013.01); *G06F 3/0673* (2013.01); *G06N 3/08* (2013.01); *H03M 7/6041* (2013.01)

(58) Field of Classification Search
CPC .... G06F 3/0608; G06F 3/0659; G06F 3/0661; G06F 3/067; G06F 3/0673; G06F 17/10;
(Continued)

(56) References Cited

U.S. PATENT DOCUMENTS 5,864,857 A  *  1/1999  Ohata .................. G06F 16/2264
7,698,285 B2 *  4/2010  Grosset ............... G06F 16/2264
                                                    707/999.1
(Continued)

FOREIGN PATENT DOCUMENTS

JP    2011-530234 A    12/2011
JP    2018-74604 A     5/2018
(Continued)

OTHER PUBLICATIONS

Patent Cooperation Treaty, International Search Report, Application No. PCT/JP2020/047314, dated Mar. 9, 2021.

*Primary Examiner* — Aracelis Ruiz
(74) *Attorney, Agent, or Firm* — Procopio, Cory, Hargreaves & Savitch LLP

(57) ABSTRACT

To generate an optimum compressor irrespective of the number of dimensions and a format of a multidimensional dataset. A storage system refers to dimension setting information, which is information representing an attribute for each of data dimensions of the multidimensional dataset, and generates a compressor based on the dimension setting information.

18 Claims, 15 Drawing Sheets

(58) Field of Classification Search
CPC .. G06N 3/0455; G06N 3/0464; G06N 3/0495; G06N 3/08; G06N 7/01; G11B 20/10; G11B 20/12; H03M 7/40; H03M 7/6041
See application file for complete search history.

(56) References Cited

U.S. PATENT DOCUMENTS

| | | |
|---|---|---|
| 2010/0030796 A1 | 2/2010 | Netz et al. |
| 2017/0359221 A1 | 12/2017 | Hori et al. |
| 2018/0046700 A1* | 2/2018 | Bodziony ............ G06F 16/283 |
| 2019/0155684 A1 | 5/2019 | Akutsu et al. |
| 2021/0405911 A1* | 12/2021 | Navon .................. G06F 3/0646 |

FOREIGN PATENT DOCUMENTS

| | | |
|---|---|---|
| JP | 2019-95913 A | 6/2019 |
| WO | 2016/163025 A1 | 10/2016 |

\* cited by examiner

FIG. 3

DIMENSION SETTING TABLE
300

| VIRTUAL SPACE ID | DIMENSION ID | ATTRIBUTE | SIZE | SCALE | NAME |
|---|---|---|---|---|---|
| 1 | 1 | CONTINUOUS | 1048576 | 1~3 | TIME |
| 1 | 2 | CONTINUOUS | 1024 | 1~3 | LENGTH |
| 1 | 3 | CONTINUOUS | 1024 | 1~3 | WIDTH |
| 1 | 4 | DISCRETE | 100 | - | SENSOR ID |
| 311 | 312 | 313 | 314 | 315 | 316 |

FIG. 4

QUALITY SETTING TABLE
400

| VIRTUAL SPACE ID | ATTRIBUTE | VALUE RANGE | ALLOWABLE ERROR INDICATOR | ALLOWABLE ERROR AMOUNT |
|---|---|---|---|---|
| 1 | LOSSY | -1000.0 ~ +1000.0 | RMSE | 0.1 OR LESS |
| 2 | LOSSLESS | float_32bit | - | - |
| 411 | 412 | 413 | 414 | 415 |

STORAGE SYSTEM AND STORAGE CONTROL METHOD INCLUDING DIMENSION SETTING INFORMATION REPRESENTING ATTRIBUTE FOR EACH OF DATA DIMENSIONS OF MULTIDIMENSIONAL DATASET

TECHNICAL FIELD

The present invention generally relates to storage control, for example, compression control.

BACKGROUND ART

For example, there is a technique disclosed in Patent Literature 1 as a storage system that performs data compression.

CITATION LIST

Patent Literature

Patent Literature 1: Japanese Patent Laid-Open No. 2019-95913

SUMMARY OF INVENTION

Technical Problem

For productivity improvement in the industrial world, there has been increasing expectation for IoT (Internet of things). IoT data (for example, data acquired from various devices) have been continuously increasing. Accordingly, a large storage capacity is necessary.

Data multidimensionalization and diversification have been advancing. Examples of the data multidimensionalization include an increase in data dimensions. Examples of the data diversification include diversification of data dimensions. For example, concerning an image sensor, there are spectral imaging for acquiring data of multiple wavelengths and distance measurement by a TOF (Time Of Flight) camera. Multidimensional data has a larger data amount compared with one-dimensional data. If the multidimensional data increases as IoT data, a larger storage capacity is necessary. The data multidimensionalization and diversification complicate generation of an optimum compressor. If a compressor is not optimum, a compression ratio is low.

The problems described above can be present about fields other than the IoT.

Solution to Problem

A storage system refers to dimension setting information, which is information representing an attribute for each of data dimensions of a multidimensional dataset, and generates a compressor based on the dimension setting information.

Advantageous Effects of Invention

It is possible to generate an optimum (which means minimizing deterioration of information and a bit rate for the information) compressor irrespective of the number of dimensions and a format of a multidimensional dataset (when lossless compression is adopted, deterioration of information is absent and bit rate minimization in the case in which the deterioration of the information is absent is expected).

BRIEF DESCRIPTION OF DRAWINGS

FIG. 3 shows the configuration of a dimension setting table.
FIG. 4 shows the configuration of a quality setting table.

DESCRIPTION OF EMBODIMENTS

Figure 1:
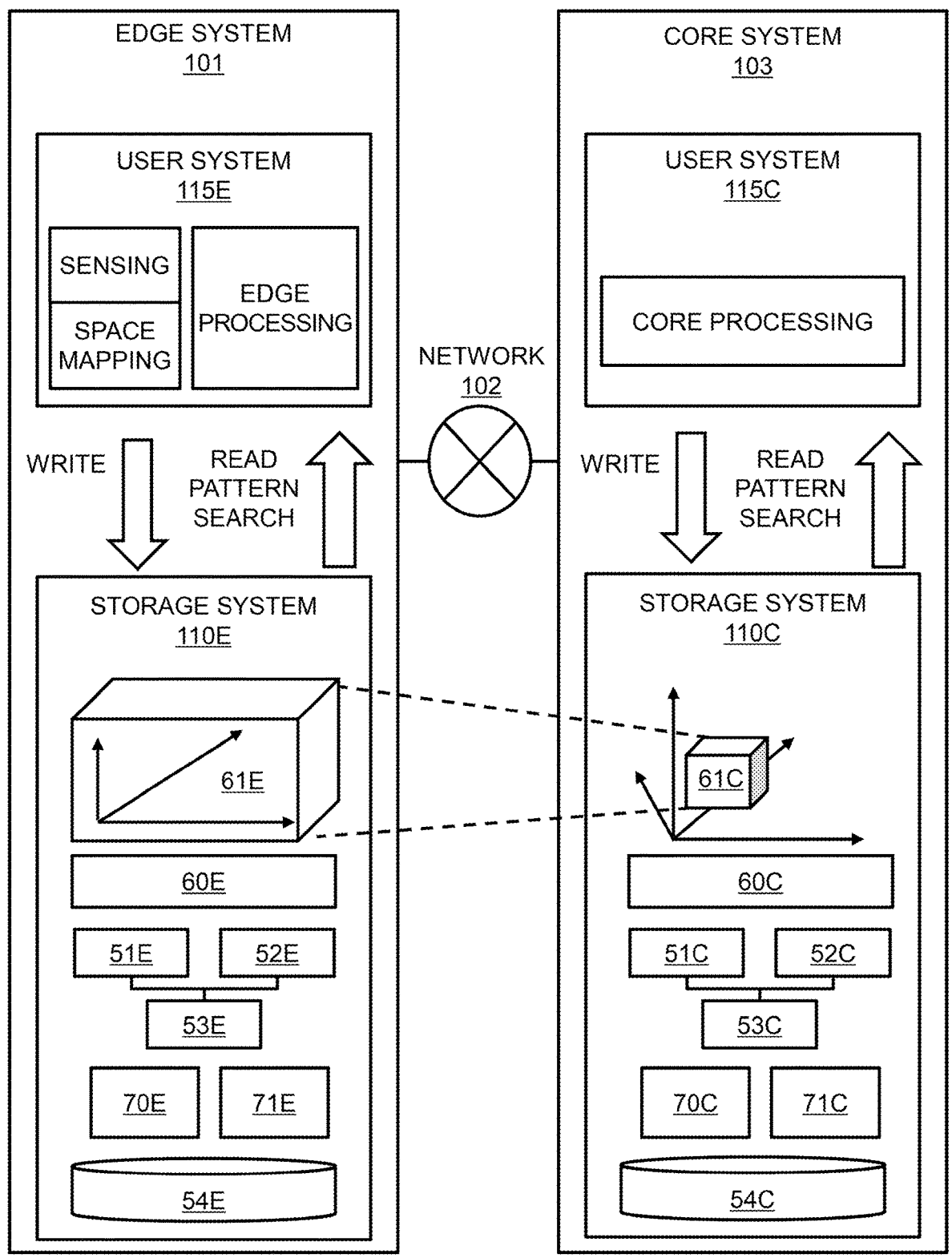
FIG. 1 shows the configuration of an entire system according to a first embodiment.

In the following explanation, an "interface apparatus" may be one or more communication interface devices. The one or more communication interface devices may be one or more same-type communication interface devices (for example, one or more NICs (Network Interface Cards)) or may be two or more different-type communication interface devices (for example, an NIC and a HBA (Host Bus Adapter)).

In the following explanation, a "memory" is one or more memory devices and may be typically a main storage device. The at least one memory device in the memory may be a volatile memory device or may be a nonvolatile memory device.

In the following explanation, a "permanent storage apparatus" is one or more permanent storage devices. The permanent storage device is typically a nonvolatile storage device (for example, an auxiliary storage device) and is specifically, for example, a HDD (Hard Disk Drive) or an SSD (Solid State Drive).

In the following explanation, a "storage apparatus" may be a physical storage apparatus such as a permanent storage apparatus or may be a logical storage apparatus correlated with the physical storage apparatus.

In the following explanation, a "processor" is one or more processor devices. At least one processor device is typically a microprocessor device such as a CPU (Central Processing Unit) but may be a processor device of another type such as a GPU (Graphics Processing Unit). The at least one processor device may be a single core or may be a multicore. The at least one processor device may be a processor core. The at least one processor device may be a processor device in a broad sense such as a hardware circuit (for example, an FPGA (Field-Programmable Gate Array) or an ASIC (Application Specific Integrated Circuit)) that performs a part or all of processing.

In the following explanation, information, an output of which is obtained with respect to an input thereof, is sometimes explained by an expression "xxx table". However, the information may be data having any structure or may be a learning model like a neural network that generates an output with respect to an input. Therefore, the "xxx table" can be referred to as "xxx information". In the following explanation, the configurations of tables are examples. One table may be divided into two or more tables or all or a part of the two or more tables may be one table.

In the following explanation, a function is sometimes explained by an expression "yyy device". However, the function may be realized by one or more computer programs being executed by a processor or may be realized by one or more hardware circuits (for example, FPGAs or ASICs). When the function is realized by a program being executed by the processor, determined processing is performed using a storage apparatus, an interface apparatus, and/or the like as appropriate, the function may be at least a part of the processor. Processing explained using the function as a subject may be processing performed by the processor or an apparatus including the processor. The program may be installed from a program source. The program source may be, for example, a program distribution computer or a recording medium (for example, a non-transitory recording medium) readable by a computer. Explanation of functions is an example. A plurality of functions may be integrated into one function or one function may be divided into a plurality of functions. Note that, examples of the yyy device include a compressor, an encoder, a decoder, a quantizer, an entropy estimator, and a controller.

In the following explanation, a "dataset" is a mass of one logical electronic data from the viewpoint of a program such as an application program and may be, for example, any one of a record, a file, a key value pair, and a tuple.

In the following explanation, when same-type elements are explained without being distinguished, common portions of reference signs are sometimes used. When the same-type elements are distinguished, the reference sings are sometimes used. For example, storage systems are not distinguished, the storage systems are sometimes referred to as "storage systems 110". When the storage systems 110 are distinguished, the storage systems 110 are sometimes referred to as "storage system 110E" and "storage system 110C".

Several embodiments of the present invention are explained below. Note that, in all of the embodiments explained below, compression may be either lossless compression or lossy compression.

First Embodiment

FIG. 1 shows the configuration of an entire system according to a first embodiment.

A plurality of edge systems 101 and one or more core systems 103 are present. The core systems 103 communicate with the edge systems 101 via a network 102 (for example, the Internet or a WAN (Wide Area Network)). One or more edge systems 101 are present for one core system 103. In the following explanation, in order to simplify explanation, one edge system 101 and one core system 103 are explained as an example.

The edge system 101 includes a user system 115E and a storage system 110E.

The user system 115E may be a physical system (for example, physical one or more computers) or may be a system (for example, a virtual computer) provided on a physical system including a plurality of kinds of calculation resources (for example, an interface apparatus, a storage apparatus, a memory, and a processor connected to the foregoing). The user system 115E may be a system to which one or more sensors are connected or may be a system including one or more sensors. The user system 115E can perform at least one of sensing, edge processing, space mapping, data write, data read, and pattern search.

The "sensing" means collecting multidimensional datasets from one or more sensors.

The "edge processing" means processing for directly transmitting or processing and transmitting a collected multidimensional dataset to the core system 103. Note that, instead of or in addition to the user system 115E performing the edge processing, a multidimensional dataset written in the storage system 110E may be directly written or processed by at least one of the storage systems 110E and 110C and written in the storage system 110C in the core system 103.

The "space mapping" means mapping a multidimensional dataset to a virtual space 61E provided by the storage system 110E and is, for example, affine transformation for transforming coordinates (for example, values for each of data dimensions) in a coordinate system of a real space into coordinates (for example, addresses for each of virtual dimensions) in a coordinate system of the virtual space 61E.

The "data write" means transmitting, to the storage system 110E, a write request for writing a write target multidimensional dataset in the virtual space 61E. In response to the write request, the multidimensional dataset is written by the storage system 110E.

The "data read" means transmitting, to the storage system 110E, a read request for reading a read target multidimensional dataset from the virtual space 61E. In response to the read request, the multidimensional dataset is read by the storage system 110E and transmitted to the user system 115E.

The "pattern search" means transmitting, to the storage system 110E, a pattern search request, which is a search request for data having a pattern, a similarity degree of which to a designated data pattern is a fixed value or more. In response to the pattern request, an address of a found multidimensional dataset (or found data itself) is transmitted to the user system 115E by the storage system 110E.

The storage system 110E communicates with the user system 115E via a not-shown internal network (for example, a LAN (Local Area Network)). The storage system 110E includes an interface apparatus 51E, a permanent storage apparatus 54E, a memory 52E, and a processor 53E connected to the foregoing. The interface apparatus 51E is connected to the network 102 and the not-shown internal network. The memory 52E stores management information including a logical-physical table explained below and one or more computer programs. The processor 53E executes the one or more computer programs.

At least a part of the computer programs are executed by the processor 53E, whereby a compressor 70E and a controller 71E are realized.

The compressor 70E can perform both of encoding (compression) and decoding (decompression). The compressor 70E may be referred to as "compressor decompressor 70E". A write target multidimensional dataset is encoded by the compressor 70E. Encoded data (a compressed multidimensional dataset) read from a physical space 60E is decoded by the compressor 70E.

The controller 71E causes the compressor 70E to execute learning and processes a request to the storage system 110E.

The controller 71E provides one or more virtual spaces 61E and manages one or more physical spaces 60E.

The virtual space 61E is a multidimensional address space. A plurality of dimensions (a plurality of virtual dimensions) defining the virtual space 61E are the same as a plurality of dimensions (a plurality of data dimensions) belonging to a multidimensional dataset. Logical address information, which is address information used for access to the virtual space 61E, includes an ID of the virtual space 61E and an address belonging to each of the plurality of virtual dimensions defining the virtual space 61E.

The physical space 60E is a one-dimensional address space (for example, a space of an LBA (Logical Back Address) provided by the permanent storage apparatus 54E.

Logical address information (for example, information including an ID of the virtual space 61E and an address in the virtual space 61E) may be designated from the user system 115E. However, in this embodiment, the controller 71E may convert access destination information (for example, an ID of a multidimensional dataset or an address in a real space) designated by a write request or a read request from the user system 115E into logical address information (for example, information including address groups for each of dimensions) and specify physical address information (for example, information including an ID of the physical space 60E and an address in the physical space 60E) from the logical address information after the conversion.

According to the example shown in FIG. 1, a storage system 110 is a physical storage system (for example, one or more physical storage apparatuses) such as a storage system of an on-premise type. However, instead of the physical storage system, the storage system 110 may be a virtual storage system (for example, a system realized on a system including a plurality of kinds of calculation resources) such as a storage system of a Cloud type. The calculation resources may be hardware resources such as a processor and a memory or may be equivalent to an instance.

The core system 103 includes a user system 115C and the storage system 110C.

The user system 115C is different from the user system 115E in the following points. That is, the user system 115C may not perform the sensing, the edge processing, and the space mapping. The user system 115C performs core processing. The "core processing" is processing for receiving a multidimensional dataset (a multidimensional dataset acquired by sensing or a multidimensional dataset after processing of the acquired multidimensional dataset) from each of the one or more edge systems 101. The user system 115C transmits a write request, a read request, or a pattern search request to the storage system 110.

The storage system 110C may be the same as the storage system 110E. The storage system 110C may be either a physical storage system or a virtual storage system irrespective of whether the storage system 110E is a physical storage system or a virtual storage system.

A virtual space 61C included in the storage system 110C may be associated with the virtual space 61E included in the storage system 110E. In this case, multidimensional datasets are stored in both of the virtual spaces 61E and 61C. A scale of the multidimensional dataset stored in the virtual space 61C is the same as or smaller than a scale of the multidimensional dataset stored in the virtual space 61E. For example, the multidimensional dataset written in the virtual space 61E is written in the virtual space 61C with a data amount reduced by the controller 71E (for example, the scale further reduced and/or compressed). Consequently, it is possible to reduce a data communication amount between the edge system 101 and the core system 103 and a consumed storage capacity of the core system 103. The controller 71E may store a part of the multidimensional dataset in the virtual space 61E (for example, a multidimensional dataset having a relatively high access frequency and/or latest access time relatively close to the present time) in the physical space 60E and store, in the virtual space 61C, the remaining multidimensional dataset in the virtual space 61E without storing the remaining multidimensional dataset in the physical space 60E (in this case, the multidimensional dataset not stored in the physical space 60E may be read from the virtual space 61C and returned as a response).

One of the edge system 101 and the core system 103 may be absent. A user system 115 may be absent in at least one of the edge system 101 and the core system 103.

The storage system according to the first embodiment of the present invention is both of the storage systems 110E and 110C but may be one of the storage systems 110E and 110C.

In the following explanation, the storage system 110E of the storage systems 110E and 110C is representatively explained as an example of the storage system. In the following explanation, the multidimensional dataset is a moving image dataset (for example, a moving image file) photographed for a certain time period by a camera, which is an example of a sensor, and, therefore, includes a plurality of frames (still image datasets).

Figure 2:
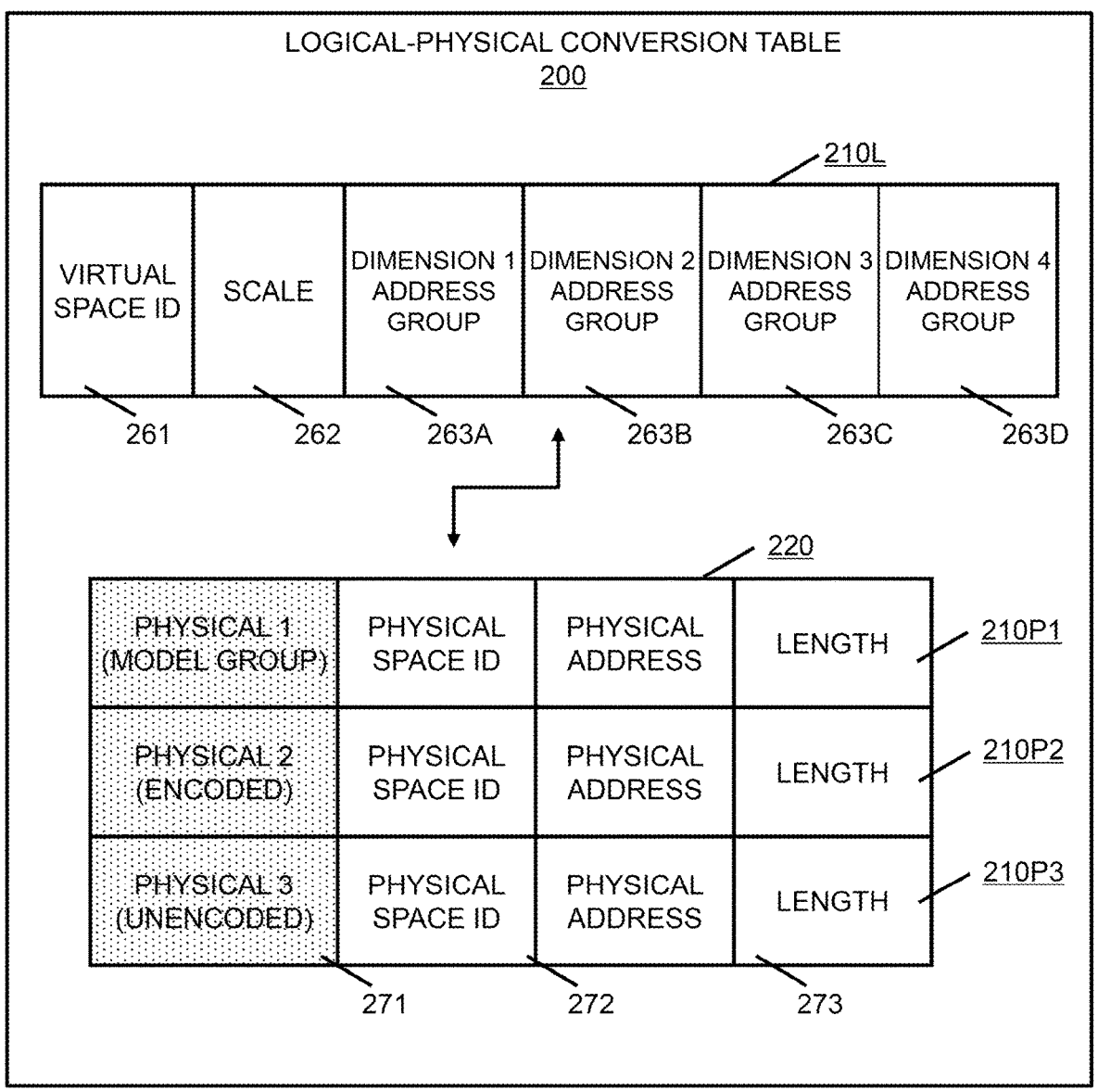
FIG. 2 shows the configuration of a logical-physical conversion table.

FIG. 2 shows the configuration of a logical-physical conversion table.

A logical-physical conversion table 200 is a table stored in the memory 52E of the storage system 110E. The logical-physical conversion table 200 represents a relation between logical address information and physical address information. The logical-physical conversion table 200 includes a plurality of records 210. Records 210L and record groups 220 corresponding to the records 210L are present for each of multidimensional datasets. The record groups 220 are associated for each of the records 210L. For example, when the number of virtual dimensions (data dimensions) is three, the records 210L (the logical address information) and the record groups 220 (the physical address information) may be associated by Hashed-Octree.

The record 210L is a record in which logical address information of a multidimensional dataset is stored. The logical address information includes information such as a virtual space ID 261, a scale 262, and address groups 263 for each of virtual dimensions (for example, four address groups 263A to 263D respectively corresponding to four virtual dimensions).

The virtual space ID 261 represents an ID of the virtual space 61E in which the multidimensional dataset is written.

The scale 262 represents a scale of the multidimensional dataset. A scale of an original multidimensional dataset is the largest. As the scale is smaller, the multidimensional dataset is coarser and a data amount of the multidimensional dataset decreases. For example, when the multidimensional dataset is a moving image dataset, a frame is curtailed according to the scale or vertical and lateral sizes of the frame are reduced. In this embodiment, scales are in multiple stages.

For virtual dimensions, the address group 263 represents an address group (one or more addresses) corresponding to positions of the multidimensional dataset among all addresses of the virtual dimensions belonging to the virtual space 61E identified from the virtual space ID. When the address group is a plurality of addresses, the plurality of addresses may be continuous addresses or may be discrete addresses.

The record group 220 is three records 210P. The records 210P are records in which physical address information is stored. The physical address information includes information such as a physical space ID 271, a physical address 272, and length 273.

The physical space ID 271 represents an ID of the physical space 60E in which a storage target is written. The physical address 272 represents an address of a write destination of the storage target (for example, a leading address of the storage target) among all addresses belonging to the physical space 60E identified from the physical space ID 271. The length represents length (a data size) of the storage target.

The "storage target" is any one of a model group, an encoded dataset, and an unencoded dataset. That is, the three records 210P functioning as the record group 220 are a record 210P1 in which physical address information of the model group is stored, a record 210P2 in which physical address information of the encoded dataset (a compressed multidimensional dataset) is stored, and a record 210P3 in which physical address information of the unencoded dataset (an uncompressed multidimensional dataset) is stored. The "model group" is one or more models, for example, a model of an encoder, a model of a decoder, and a model of an entropy estimator explained below included in the compressor 70E. The respective models are, for example, convolutional neural networks. The model of at least one of the encoder, the decoder, and the entropy estimator may be a model other than the convolutional neural network (for example, GMM (Gaussian Mixture Models), HMM (Hidden Markov Model), SCFG (Stochastic Context-Free Grammar), GAN (Generative Adversarial Nets), VAE (Variational Auto Encoder), or genetic programming). Model compression such as Mimic Model may be applied for a reduction of an information amount of a data model.

The logical address information of the multidimensional dataset stored in the virtual space 61E is stored in the record 210L. The record group 220 associated with the record 210L is, for example, as explained below.

When a model group is generated for the virtual space 61E and the generated model group is stored or already stored in the physical space 60E, the record group 220 including the record 210P1 in which physical address information of the model group is stored is correlated with the record 210L.

When the multidimensional dataset is encoded and an encoded dataset (for example, a feature value map) is stored in the physical space 60E, physical address information of the encoded dataset is stored in the record 210P2. Since the multidimensional dataset is encoded, the record 210P3 is null.

When the multidimensional dataset is stored in the physical space 60E without being encoded because a model group is not generated for the virtual space 61E or because of another reason, physical address information of the unencoded dataset is stored in the record 210P3. Since the multidimensional dataset is not encoded, the record 210P2 is null.

According to FIG. 2, in the storage system 110E, I/O (Input/Output) of a multidimensional dataset is performed through the virtual space 61E. In a write request and a read request for the virtual space 61E, logical address information, that is, information including an ID of the virtual space 61E and an address group for each of a plurality of dimensions belonging to the multidimensional dataset is designated. For example, for a dimension "time", as an address corresponding to the dimension "time", it is possible to designate first to tenth frames among a large number of frames. The controller 71E specifies physical address information from the logical-physical conversion table 200 using the designated logical address information as a key and performs, based on the specified physical address information, at least one I/O of a model and a multidimensional dataset to and from the physical space 60E. In this embodiment, the controller 71E specifies logical address information by referring to, for example, a not-shown address conversion table (for example, a table representing a correspondence relation between address information in a real space and logical address information) using, as a key, address information (for example, information representing an address in the real space) designated from the user system 115E. However, the logical address information may be designated by a write request or a read request from the user system 115E. In this embodiment, the scales of the multidimensional data are in the multiple stages. In the logical address information, a scale of write target or read target multidimensional data is designated. However, the logical address information does not always have to include a scale.

According to FIG. 2, for each of multidimensional datasets, a scale is common for all dimensions belonging to the multidimensional dataset (in other words, for each of the multidimensional datasets, a representative scale is designated). For example, when a scale smaller than a largest scale is designated as the scale 262, for virtual dimensions, a value reduced according to the scale is set as the address group 263. A scale may be designated for each of dimensions.

FIG. 3 shows the configuration of a dimension setting table.

A dimension setting table 300 is a table stored in the memory 52E of the storage system 110E. The dimension setting table 300 represents information concerning virtual dimensions of the virtual space 61E. The dimension setting table 300 is present, for example, for each of the virtual spaces 61E. The dimension setting table 300 includes a record, for example, for each of virtual dimensions (data dimensions). Records store information such as a virtual space ID 311, a dimension ID 312, an attribute 313, a size 314, a scale 315, and a name 316. In the following explanation, one virtual dimension is explained as an example ("dimension of attention" in explanation with reference to FIG. 3).

The virtual space ID 311 represents an ID of the virtual space 60E to which the dimension of attention belongs. The dimension ID 312 represents an ID of the dimension of attention.

The attribute 313 represents an attribute of the dimension of attention, specifically, whether the dimension of attention is "continuous" (a plurality of addresses belonging to the dimension of attention are continuous addresses) or "discrete" (the plurality of addresses belonging to the dimension of attention are discrete addresses). According to the example shown in FIG. 3, when the dimension of attention is "time" (photographing time length), "length" (length of a frame), or "width" (width of the frame), the addresses (for example, sizes) are continuous. On the other hand, when the dimension of attention is "sensor ID", IDs of a plurality of cameras are not always continuous. Therefore, usually, the addresses of the dimension of attention (the IDs of the cameras) are discrete.

The size 314 represents a size of the dimension of attention and is equivalent to an address of the dimension of attention in the virtual space 61E. For example, according to the example shown in FIG. 3, sizes (the numbers of pixels) of both of the length and the width of frames in the multidimensional dataset are "1024". Note that the size 314 represents a size in the case in which the scale of the multidimensional dataset is the largest. When a scale smaller than the largest scale is designated as the scale of the multidimensional dataset, for example, for a dimension of the attribute "continuous", according to the designated scale, a size of the dimension of the multidimensional dataset is set, by the controller 71E, to a size smaller than the size represented by the size 314.

The scale 315 represents a range of scales that can be taken for the dimension of attention. For example, all of scales 1 to 3 can be taken for all dimensions, attributes of which are "continuous". A larger value of n of a scale n (n is a natural number) means that a scale is larger (a data amount of the multidimensional dataset is larger). The scale 3 is the largest scale in this embodiment. The scale 315 may be different depending on a dimension. For example, the scale 2 or 3 may be valid in a certain dimension and only the scale 3 may be valid in another dimension. The scale 315 may be valid when the attribute of the dimension of attention is "continuous".

The name 316 represents a name of the dimension of attention. In this embodiment, as virtual dimensions, there are four virtual dimensions of "time" (photographing time length), "length", "width", and "sensor ID". One or more other virtual dimensions, for example, at least one of "depth" and "frequency" may be adopted instead of or in addition to at least one of the four virtual dimensions.

The dimension setting table 300 is set by a user of the user system 115E but may be set by another person or may be automatically set. Examples of a method for the automatic setting are the following methods.

That is, the controller 71E may analyze statistics of an input multidimensional dataset and create or update the dimension setting table 300 based on a result of the analysis. An ID of the virtual space 61E at a storage destination of the multidimensional dataset may be determined at random or may be determined according to a predetermined rule. The number of dimensions, an attribute, and a size are seen from the analysis of the statistics of the multidimensional dataset. For example, when the multidimensional dataset is represented as a $[i_1] [i_2] \ldots [i_n]$ ("a" is an identifier of the multidimensional dataset, "$[i_x]$" corresponds to a dimension x, and "$i_x$" is a size for the dimension x). The controller 71E inputs a $[i_1] [i_2] \ldots [i_n]$ to the compressor 70E to obtain a compression ratio c and a deterioration degree d. The controller 71E calculates $i_{1 \ldots n}$ and n that optimize c and d in a function $f(a, i_{1 \ldots n}, n) \geq (c, d)$ (f is a function, $i_{1 \ldots n}$ is $i_1, i_2, \ldots,$ and $i_n$, and n is the number of dimensions). A specific example of the automatic setting is, for example, as explained below.

When the multidimensional dataset retains information representing the number of dimensions and a size (for example, when the multidimensional dataset is a file of an npy (tensor) format), the controller 71E may determine, according to whether a correlation coefficient of addresses (values) between dimensions is equal to or larger than a threshold, whether the attribute is "continuous" or "discrete" and create a dimension setting table reflecting the determined attribute. For example, if the correlation coefficient is equal to or larger than the threshold, the attribute is "continuous". If the correlation coefficient is smaller than the threshold, the attribute is "discrete". Besides, the information such as the scale and the name may be set as appropriate from preset values or may be set as appropriate based on statistics of a use history of the user.

When a dimension structure of the multidimensional dataset is lost (for example, when the multidimensional dataset is a file of a general binary format), the controller 71E may determine, with reinforced learning (for example, reinforced learning with a compression ratio set as a reward), as parameters, information items of the dimension setting table such as the number of dimensions, the size for each of dimensions, and the attribute of the multidimensional dataset and create a dimension setting table reflecting the determined parameters. Besides, the information such as the scale and the name may be set as appropriate from the preset values or may be set as appropriate based on the statistics of the use history of the user.

FIG. 4 shows the configuration of a quality setting table.

A quality setting table 400 is a table stored in the memory 52E of the storage system 110E. The quality setting table 400 represents a condition of quality (in other words, allowable quality) of a multidimensional dataset stored in the virtual space 61E. For example, the quality setting table 400 includes records for each of the virtual spaces 61E (for example, the condition of the quality may be set in any unit such as each of ranges in the virtual space 61E instead of each of the virtual spaces 61E). The records store information such as a virtual space ID 411, an attribute 412, a value range 413, an allowable error indicator 414, and an allowable error amount 415.

The virtual space ID 411 represents an ID of the virtual space 61E. The attribute 412 represents whether compression of the multidimensional dataset stored in the virtual space 61E is "lossless" or "lossy". The value range 413 represents a range of a value of the multidimensional dataset (for example, a range of a value of a pixel in an image). The allowable error indicator 414 and the allowable error amount 415 are information effective when the compression is "lossy". The allowable error indicator 414 represents a type of a calculated error (for example, "RMSE" (Root Mean Squared Error)). The allowable error amount 415 represents a condition of a value allowed as a value of the calculated error (for example, a range of an allowable error).

Several kinds of processing performed in this embodiment are explained below.

Figure 5:
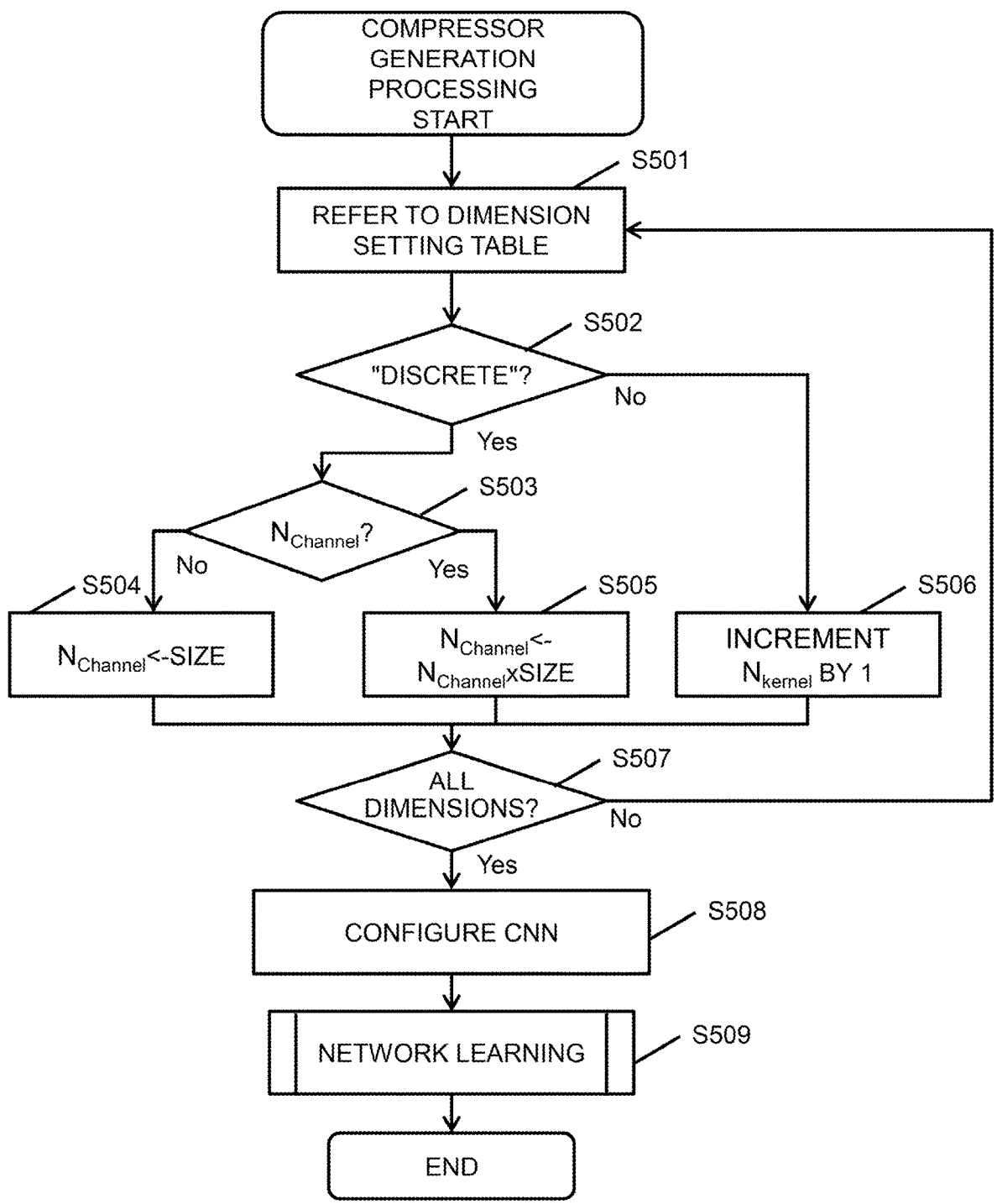
FIG. 5 shows a flow of compressor generation processing.

FIG. 5 shows a flow of compressor generation processing. Note that, before the compression generation processing, setting of the dimension setting table 300 and the quality setting table 400 is finished in predetermined initialization processing. In this embodiment, models of all of an encoder, a decoder, and an entropy estimator are convolutional neural networks.

The compressor generation processing may be started, for example, with any one of the following as an opportunity.

The controller 71E receives a compressor generation request designating a virtual space ID (a request for generating a compressor). The compressor generation request is transmitted from, for example, the user system 115E (or a management system (not shown) of the storage system 110E).

The controller 71E regularly or irregularly checks, for each of the virtual spaces 61E, whether a model group is created (for example, refers to the logical-physical conversion table 200), whereby the virtual space 61E in which a model group is not created is found.

In the following explanation, in explanation with reference to FIG. 5, the virtual space 61E that is a target of the compressor generation processing is referred to as "virtual space of attention 61E".

The controller 71E refers to the dimension setting table 300 (S501).

The controller 71E determines whether the attribute 313 of an unprocessed dimension of attention is "discrete" (S502). The "unprocessed dimension" is a virtual dimension, the attribute 313 of which is not referred to yet, among virtual dimensions belonging to the virtual space of attention. The "unprocessed dimension of attention" is an unprocessed dimension paid attention (selected) by the controller 71E among one or more unprocessed dimensions.

When a determination result in S502 is true (S502: Yes), that is, the attribute 313 of the unprocessed dimension of attention is "discrete", the controller 71E determines whether a value is set in $N_{Channel}$ (the number of channels) (S503).

When a determination result in S503 is false (S503: No), the controller 71E sets a value of the size 314 of the unprocessed dimension of attention in $N_{Channel}$ (S504). Consequently, the value is set in $N_{Channel}$.

When the determination result in S503 is true (S503: Yes), the controller 71E changes the value of $N_{Channel}$ to a product of the value set in $N_{Channel}$ and the value of the size 314 of the unprocessed dimension of attention (S505).

When the determination result in S502 is false (S502: No), that is, when the attribute 313 of the unprocessed dimension of attention is "continuous", the controller 71E increments a value of $N_{Kernel}$ (the number of kernel dimensions) by one (S506).

After S504 to S506, the controller 71E determines whether the attribute 313 of all virtual dimensions in the virtual space of attention is referred to (S507). When a determination result in S507 is false (S507: No), S501 is performed for any one of the unprocessed dimensions, whereby an attribute 503 of the unprocessed dimension is specified.

When the determination result in S507 is true (S507: Yes), the controller 71E configures a CNN (convolutional neural network) of each of the encoder, the decoder, and the entropy estimator (S508). The configuration of the CNN is determined based on $N_{Channel}$ and $N_{Kernel}$. In S508, a type of a kernel is determined based on $N_{Kernel}$, the number of channels is determined based on $N_{Channel}$, and a parameter group of NN is initialized.

Thereafter, the controller 71E performs network learning (learning of the CNN) (S509).

According to the CNN, comprehensive processing is performed in a channel direction (for example, a fully connected layer is present) and processing is performed in a range of the kernel. Accordingly, as characteristics of the CNN, an input that is discontinuous and does not depend on order is preferably the channel and a continuous input is processed using the kernel. Therefore, according to the example shown in FIG. 5, the number of virtual dimensions having the attribute "discrete" and the size 314 affect $N_{Channel}$ (the number of channels) and the number of virtual dimensions having the attribute "continuous" affects $N_{Kernel}$ (the number of kernel dimensions). This contributes to automatically generating a CNN optimum for the number of dimensions and a form of the multidimensional dataset.

Figure 6:
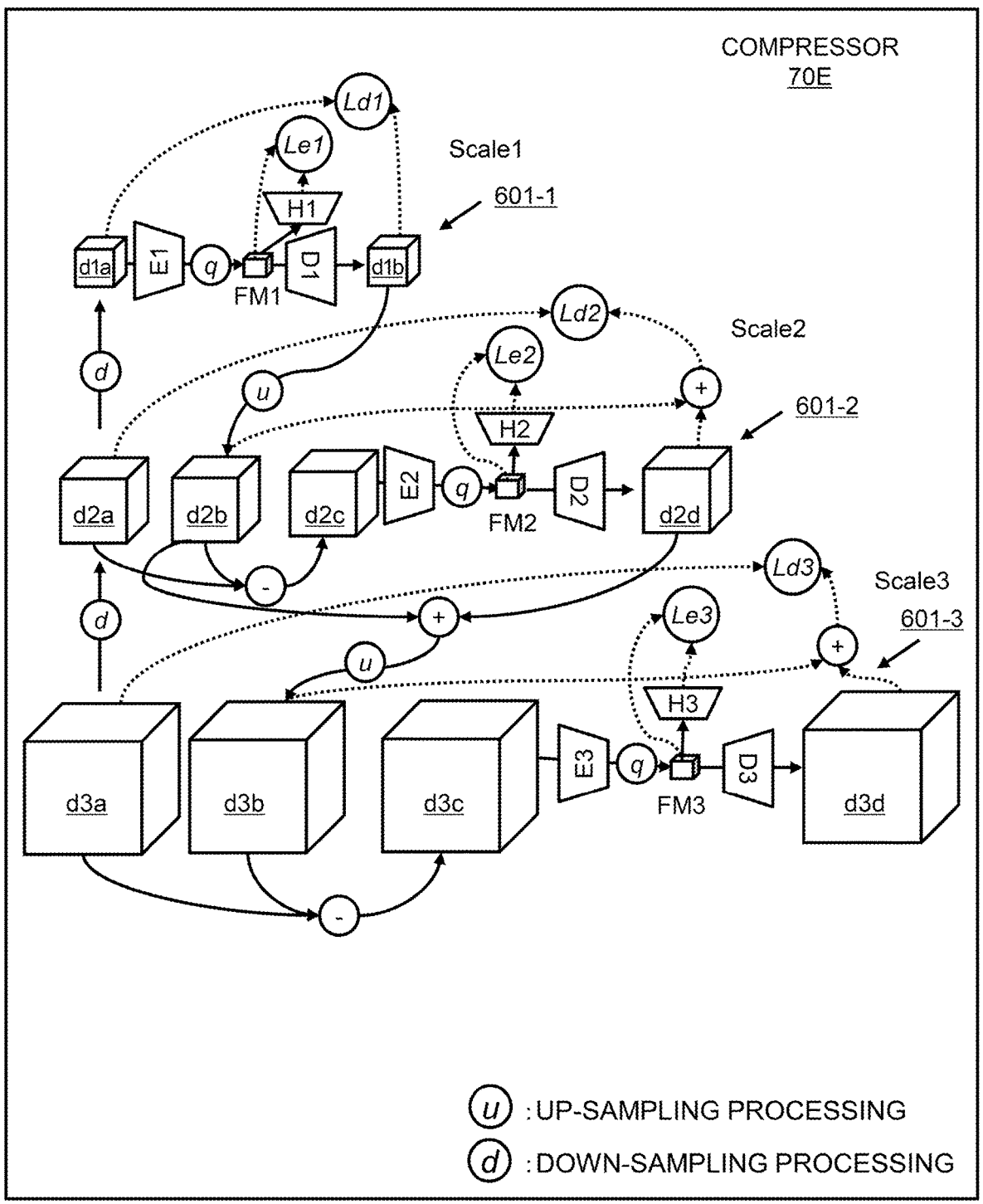
FIG. 6 shows an overview of network learning.

FIG. 6 shows an overview of the network learning (S509).

The compressor 70E is configured as explained below.

That is, when scales are in m stages (m is a natural number), that is, there are a scale 1, a scale 2, and a scale m, the compressor 70E includes processing units 601 for each of the scales. In this embodiment, since m=3, there are processing units 601-1 to 601-3 respectively corresponding to the scales 1 to 3. Signs of elements corresponding to a scale n (n is an integer of each of 1 to m, in this example, n=1, 2, or 3) include n as appropriate.

A processing unit 601-$n$ includes an encoder En, a decoder Dn, and an entropy estimator Hn. A quantizer q is common in a plurality of processing units 601-1 to 601-3. However, the quantizer q may be present for each of the processing units 601. A feature value map FMn is generated in the processing unit 60-1$n$. $Ld_i$ represents a deterioration degree and is, specifically, for example, an error indicator function (for example, PSNR (Peak Signal-to-Noise Ratio), MSE (Mean Square Error), or MS-SSIM (Multi-Scale Structural Similarity)). $Le_i$ represents a bit rate and is, specifically, for example, a function for comparing an entropy (for example, a probability distribution representing predicted appearance probabilities of symbols) represented by an output of the entropy estimator Hn to which the feature value map FMn is input and the feature value map FMn (for example, a probability distribution representing appearance probabilities of correct answers of the symbols). The controller 71E combines $Ld_i$ and $Le_i$ using a Lagrange multiplier (X) and learns a formula of the combination as a loss function.

The processing units 601-1 to 601-3 are sequentially correlated in the order of the scales. Specifically, an output of the processing unit 601-$n$ affects an input of a processing unit 601-($n$+1).

Network learning explained below is performed for the compressor 70E having such a configuration.

A multidimensional dataset d3$a$ is input. The multidimensional dataset d3$a$ is an original multidimensional dataset. The multidimensional dataset d3$a$ may be a multidimensional dataset separately prepared as a teacher dataset or may be a write target multidimensional dataset input from the user system 115E.

The compressor 70E down-samples the multidimensional dataset d3$a$ to a multidimensional dataset d2$a$. For example, a reduction ratio (for example, ½) for reducing a size every time a scale decreases one stage is determined. Concerning data dimensions belonging to the multidimensional dataset d3$a$, a size for the data dimensions is reduced according to the reduction ratio. For example, vertical and horizontal numbers of pixels of a frame and the number of frames per one second are reduced to halves.

The compressor 70E down-samples the multidimensional dataset d2$a$ to a multidimensional dataset d1$a$.

In this way, the compressor 70E reduces a scale of the multidimensional dataset d3$a$ to a smallest scale stepwise, that is, down-samples the multidimensional dataset d3$a$ stepwise. When the down-sampling ends to the multidimensional dataset d1$a$ corresponding to the smallest scale, processing explained below is performed stepwise from the smallest scale to the largest scale. Processing performed for each of the scales 1 to 3 is explained below.

<Processing for the Scale 1>

For example, the compressor 70E sets a data format of the multidimensional dataset d1$a$ to a predetermined format and inputs the multidimensional dataset d1$a$ to an encoder E1. The encoder E1 encodes the input multidimensional dataset d1$a$. The quantizer q generates a feature value map FM1 of the encoded multidimensional dataset d1$a$. An entropy estimator H1 calculates Le$_1$ (for example, a function for comparing probabilities of cross entropy and the like) based on appearance probabilities of symbols calculated based on prediction by an autoregression model or the like, information saved for other probability prediction, prediction concurrently using the autoregression model or the like and the information, or the like and appearance probabilities of symbols of correct answers directly calculated from the feature value map FM1. A decoder D1 generates a multidimensional dataset d1$b$ (a decoded multidimensional dataset) based on the feature value map FM1. The controller 71E calculates an error between the multidimensional datasets d1$a$ and d1$b$ using Ld$_i$.

<Processing for the Scale 2>

The compressor 70E up-samples the multidimensional dataset d1$b$ to a multidimensional dataset d2$b$. For example, an enlargement ratio (for example, 2) of a size enlarged every time a scale is increased one stage is determined. Concerning data dimensions belonging to the multidimensional dataset d1$b$, sizes for the data dimensions are enlarged according to the enlargement ratio. Note that the enlargement ratio may be the inverse of the reduction ratio.

The multidimensional dataset d2$b$ is a dataset having the same scale as the multidimensional dataset d2$a$. However, since the multidimensional dataset d2$b$ is a dataset obtained through down-sampling, encoding, decoding, and up-sampling of the multidimensional dataset d2$a$, the multidimensional dataset d2$b$ is not always completely the same as the multidimensional dataset d2$a$. The compressor 70E calculates a difference dataset d2$c$ between the multidimensional dataset d2$a$ and the multidimensional dataset d2$b$. For example, the compressor 70E sets a data format of the difference dataset d2$c$ to a predetermined format and inputs the difference dataset d2$c$ to an encoder E2. The encoder E2 encodes the input difference dataset d2$c$. The quantizer q generates a feature value map FM2 of the encoded difference dataset d2$c$. An entropy estimator H2 calculates Le$_2$ based on a value calculated based on the feature value map FM2 and the feature value map FM2. A decoder D2 generates a difference dataset d2$d$ (a decoded difference dataset) based on the feature value map FM2. The difference dataset d2$d$ is a decoded dataset after lossy compression of the difference dataset d2$c$ between the multidimensional datasets d2$a$ and d2$b$. Accordingly, a sum of the multidimensional dataset d2$b$ and the difference dataset d2$d$ is equivalent to a decoded dataset 2, which is a decoded dataset after lossy compression of the multidimensional dataset d2$a$. The controller 71E calculates an error between the multidimensional dataset d2$a$ and the decoded dataset 2 using Ld$_2$.

<Processing for the Scale 3>

Processing for the scale 3 is substantially the same as the processing for the scale 2. That is, the compressor 70E up-samples the sum of the multidimensional dataset d2$b$ and the difference dataset d2$d$ to a multidimensional dataset d3$b$. The compressor 70E calculates a difference dataset d3$c$ between the multidimensional dataset d3$a$ and the multidimensional dataset d3$b$. For example, the compressor 70E sets a data format of the difference dataset d3$c$ to a predetermined format and inputs the difference dataset d3$c$ to an encoder E3. The encoder E3 encodes the input difference dataset d3$c$. The quantizer q generates a feature value map FM3 of the encoded difference dataset d3$c$. An entropy estimator H3 calculates Le$_3$ based on a value calculated based on the feature value map FM3 and the feature value map FM3. A decoder D3 generates a difference dataset d3$d$ (a decoded difference dataset) based on the feature value map FM3. A sum of the multidimensional dataset d3$b$ and the difference dataset d3$d$ is equivalent to a decoded dataset 3, which is a decoded dataset after lossy compression of the multidimensional dataset d3$a$. The controller 71E calculates an error between the multidimensional dataset d3$a$ and the decoded dataset 3 using Ld$_3$.

The processing for each of the scales 1 to 3 is as explained above.

The controller 71E learns the CNN of each of the encoder En, the decoder Dn, and the entropy estimator Hn in the compressor 70E such that L calculated using a loss function indicated by the following Math. 1 is minimized. The controller 71E combines Ld$_i$ and Le$_i$ using the Lagrange multiplier (X). An example of the formula of the combination is the loss function indicated by Math. 1.

$$L = \sum_{i=1}^{n} \lambda_{d_i} L_{d_i} + \lambda_e \sum_{i=1}^{n} L_{e_i}$$ [Math. 1]

According to an example shown in FIG. 6, the processing units 601 are present for each of the scales and the processing units 601 of the scales are learned. As explained above, in write processing, for scales equal to or lower than a scale designated by a write request, datasets encoded by the processing units 601 corresponding to the scales are stored. In read processing, an encoded dataset corresponding to a scale designated by a read request is decoded by the processing unit 601 corresponding to the designated scale. As a comparative example, it is conceivable to use one processing unit common to a plurality of scales as a compressor. However, in this case, down-sampling of a decoded dataset is necessary depending on the scale designated by the read request. In this embodiment, it is possible to realize the read processing being performed more efficiently than such a comparative example.

According to such write processing and read processing, data also needs to be stored for scales other than the designated scale. Accordingly, a consumed storage capacity increases. Therefore, in this embodiment, a plurality of processing units 601 respectively corresponding to the plurality of scales are sequentially correlated in the order of the scales. If the scale n is not the smallest scale, a dataset obtained by encoding a difference between a multidimensional dataset in the scale n and a decoded dataset in the scale n is stored instead of an encoded dataset of the multidimensional dataset itself in the scale n. Consequently, it is possible to reduce the increase in the consumed storage capacity. Note that "the decoded dataset in the scale n" is a dataset obtained by irreversibly compressing and thereafter decoding the multidimensional dataset in the scale n or a dataset equivalent to the dataset.

The network learning may be performed in a pre-stage of reception of a write target multidimensional dataset from the user system 115E but may be performed using the write target multidimensional dataset input from the user system 115E (that is, dynamically). A multidimensional dataset used in the network learning may be multidimensional datasets input from the user system 115E or may be a multidimensional dataset designated as a multidimensional dataset for learning (as teacher data) from the user system 115E among one or more multidimensional datasets received from the user system 115E. When the controller 71E analyzes statistics of the write target multidimensional dataset received from the user system 115E and detects a change of data characteristics of the multidimensional dataset, the network learning may be performed using a multidimensional dataset belonging to the data characteristics after the change. A model group may be updated as appropriate, a new model group may be added to the physical space 60E, and, for the same virtual space 61E, an associated model group (physical address information of the model group) may be different depending on logical address information. That is, one or a plurality of compressors 70E may be present for one virtual space 61E.

A configuration and processing illustrated in FIG. 6 can be expressed, for example, as explained below.

- A compressor includes, for each of scales, a processing unit corresponding to the scale. Processing units include encoders, decoders, and entropy estimators (estimators that estimate, based on feature value maps based on multidimensional datasets encoded by the encoders, entropy of multidimensional datasets input to the encoders).
- Errors obtained for the processing units in the scales are elements of an error of the entire compressor.
- Concerning the scales, errors obtained for the processing units in the scales are based on deterioration degrees and bit rates.
- When the scale n is the smallest scale, a deterioration degree for the scale n is based on an error between (A) and (B).
- (A) is a dataset obtained by down-sampling an input multidimensional dataset for the scale n.
- (B) is a dataset output from a decoder in the scale n when (A) is input to an encoder in the scale n.
- When the scale n is any scale other than the smallest scale, the deterioration degree for the scale n is based on an error between (C) and (D).
- (C) is an input multidimensional dataset or a dataset obtained by down-sampling the multidimensional dataset for the scale n.
- (D) is a sum of (d1) and (d2).
- (d1) is (d11) when the scale n is a second smallest scale and is (d12) when the scale n is any scale other than the second smallest scale.
- (d11) is a dataset obtained by up-sampling (B) for the scale n.
- (d12) is a dataset obtained by up-sampling (D) corresponding to a scale (n−1) for the scale n.
- (d2) is a dataset output from the decoder in the scale n when a difference dataset in the scale n is input to the encoder in the scale n. The difference dataset in the scale n is a difference between (C) and (d1).
- Concerning the scales, bit rates obtained for the processing units in the scales are based on a feature value map based on (A) or (C) and entropy calculated by the entropy estimators in the scales based on the feature value map.

Incidentally, when the virtual space of attention is the virtual space 61E, the attribute 412 of which is "lossless", the compressor 70E corresponding to the virtual space 61E is set as the compressor 70E for lossless compression. In this case, in the compressor 70E, the encoder En, the quantizer q, and the decoder Dn for lossy compression for each of the scales are unnecessary. The compressor 70E may include a processing unit for lossless compression for each of the scales (or in common to all the scales). Compression in the case in which an input is a floating point number only has to divide and symbolize the floating point number with uchar (for example, when float32 is adopted as a compression scheme, divide the floating point number into four with uchar and set information of 256 symbols to four channels in each of the divided floating point numbers) to input the floating point number to an entropy estimator in the processing unit.

Figure 7:
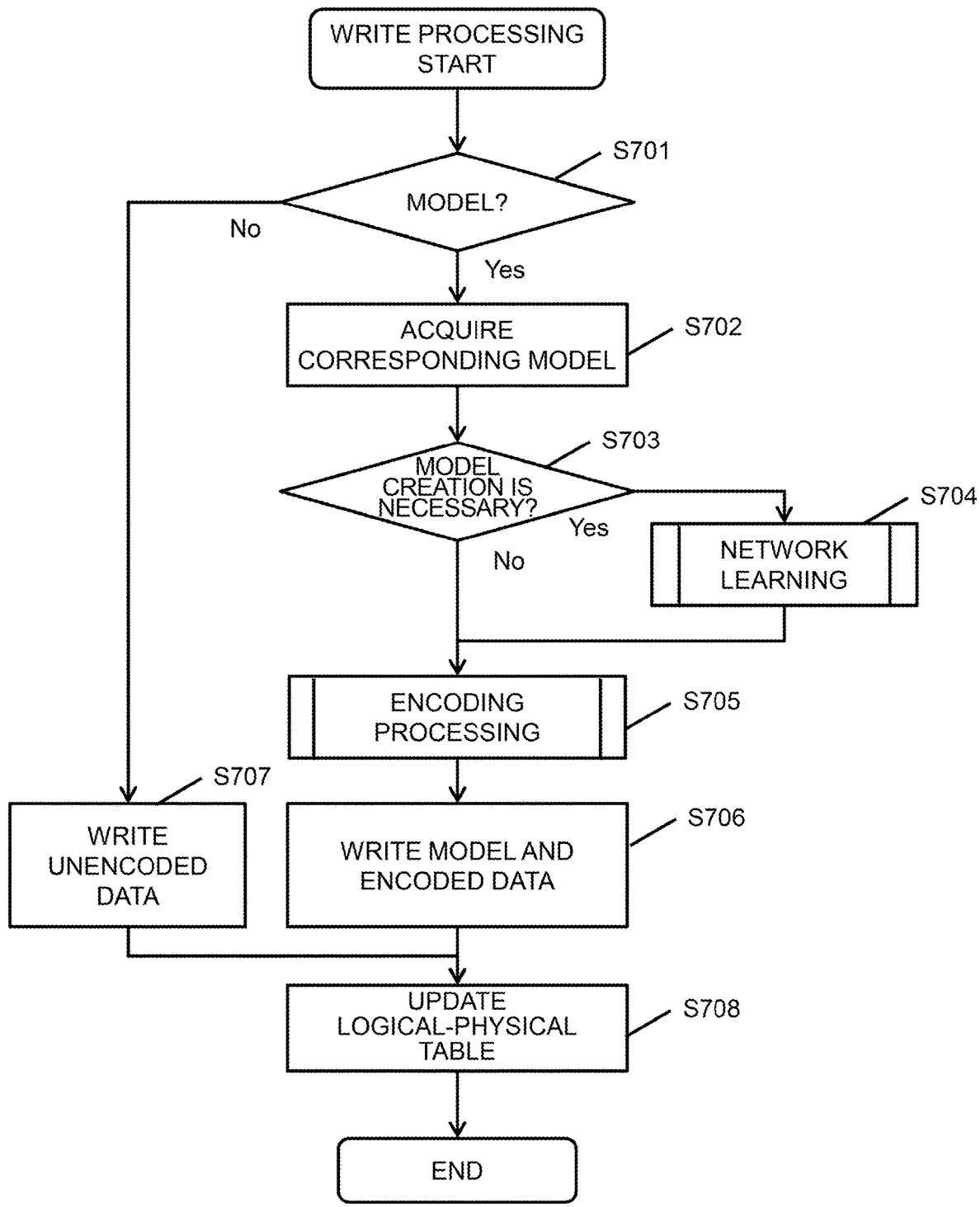
FIG. 7 shows a flow of write processing.

FIG. 7 shows a flow of the write processing.

The write processing is performed when the controller 71E receives a write request for a write target multidimensional dataset. Logical address information is specified by the controller 71E. The logical address information may be designated by the write request or may be specified from address information designated by the write request.

The controller 71E refers to the logical-physical conversion table 200 using the specified logical address information as a key and determines whether physical address information of a model group corresponding to the logical address information is present (S701). For example, a determination result in S701 is false when the same logical address information as the specified logical address information is absent in the logical-physical conversion table 200 or when a model group is absent for the virtual space 61E at a write destination (the virtual space 61E identified from a virtual space ID included in the specified logical address information).

When the determination result in S701 is false (S701: No), the controller 71E writes the write target multidimensional dataset in the virtual space 61E at the write destination (the virtual space 61E identified from the virtual space ID included in the specified logical address information) without encoding the write target multidimensional dataset (S707). The controller 71E updates the logical-physical conversion table 200, specifically, updates logical address information specified for the write request and physical address information of an unencoded dataset corresponding to the logical address information (S708).

When the determination result in S701 is true (S701: Yes), the controller 71E specifies physical address information of a model group corresponding to the specified logical address information and acquires the model group from the physical space 60E based on the physical address information (S702). The controller 71E determines whether model creation (re-learning of a compressor including the model group) is necessary (S703). For example, when the controller 71E detects that a tendency of data characteristics of a multidimensional dataset written in the virtual space 61E at the write destination changes, a determination result in S703 is true.

When the determination result in S703 is true (S703: Yes), the controller 71E performs the network learning for the virtual space 61E at the write destination (S704). A multidimensional dataset used for the network learning may be a multidimensional dataset designated from the user, may be a write target multidimensional dataset, or may be a multidimensional dataset written in a nearest predetermined period. The network learning is as explained with reference to FIG. 6.

When the determination result in S703 is false (S703: No) or after S704, encoding processing is performed (S705). That is, the write target multidimensional dataset is input to the compressor 70E by the controller 71E, whereby the write target multidimensional dataset is encoded. The controller 71E writes the multidimensional dataset encoded in S705 in the virtual space 61E at the write destination (S706). The controller 71E updates the logical-physical conversion table 200, specifically, updates physical address information of an encoded dataset corresponding to the logical address information specified for the write request (S708). Note that, when the network learning (S704) is performed, in S706, the controller 71E writes the model group as well in the virtual space 61E at the write destination. In S708, the controller 71E updates the physical address information of the model group corresponding to the logical address information specified for the write request.

Note that the controller 71E may regularly or irregularly checks presence or absence of an unencoded dataset for the records 210L in the logical-physical conversion table 200 and, if an unencoded dataset is present, use the compressor 70E including the model group corresponding to the write destination virtual space 61E of the unencoded dataset (if the compressor 70E is absent, generate the compressor 70E through compressor generation processing), convert unencoded dataset into an encoded dataset, store the encoded dataset in the physical space 60E instead of (or in addition to) the unencoded dataset, and update the logical-physical conversion table 200.

Figure 8:
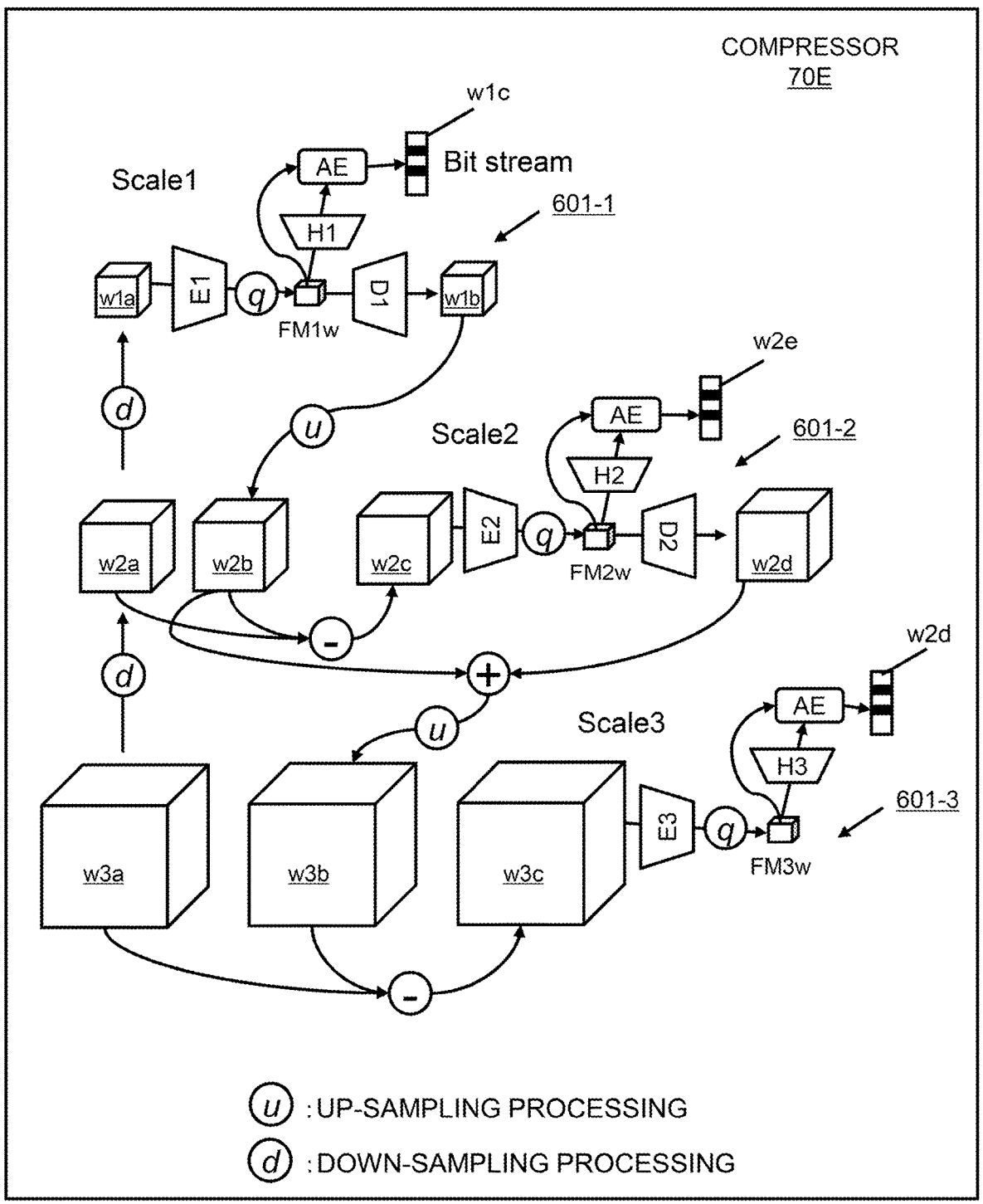
FIG. 8 shows an example of an overview of encoding processing.

FIG. 8 shows an example of an overview of the encoding processing (S705). Note that signs of elements for the scale n includes n as in FIG. 6 (n is any one natural number of 1 to 3).

A scale is specified by the controller 71E from the logical address information specified for the write request. The encoding may be performed only for a scale specified for the write request. However, in this embodiment, the encoding is performed for each of scales equal to or smaller than the specified scale. Consequently, speed of read processing explained below is expected to be high. Note that encoding for a scale larger than the specified scale is unnecessary.

According to an example shown in FIG. 8, the specified scale is the scale 3 (the largest scale) and scales equal to or smaller than the scale 3 are the scale 3, the scale 2, and the scale 1. Accordingly, in this embodiment, the encoding is performed for each of the scales 1 to 3. A flow of the encoding processing conforms to the configuration of the compressor 70E.

That is, the compressor 70E down-samples an input write target multidimensional dataset w3a for the scale 2. Consequently, a multidimensional dataset w2a in the scale 2 is generated. The compressor 70E down-samples the multidimensional dataset w2a for the scale 1. Consequently, a multidimensional dataset w1a in the scale 1 is generated.

The multidimensional dataset w1a is converted into a feature value map FM1w through the encoder E1 and the quantizer q. AE (encoding processing of arithmetic coding) is performed based on the feature value map FM1w and entropy based on the feature value map FM1w (a value obtained by inputting the feature value map FM1w to the entropy estimator H1) and a bitstream w1c is generated. The bitstream w1c is equivalent to an encoded dataset of the multidimensional dataset w1a.

Similarly, for each of the scale 2 and the scale 3, a bitstream functioning as an encoded dataset is generated.

The bitstream generation for the scale 2 is as follows. That is, a difference dataset w2c is converted into a feature value map FM2w through the encoder E2 and the quantizer q. AE is performed and a bitstream w2e is generated based on the feature value map FM2w and entropy based on the feature value map FM2w (a value obtained by inputting the feature value map FM2w to the entropy estimator H2). Note that the difference dataset w2c is a difference between the multidimensional dataset w2a and a multidimensional dataset w2aw2b. The multidimensional dataset w2b is a dataset obtained by up-sampling the multidimensional dataset w1b for the scale 2. The multidimensional dataset w1b is a dataset output from the decoder D1 when FM1w is input to the decoder D1.

The bitstream generation for the scale 3 is as follows. That is, a difference dataset w3c is converted into a feature value map FM3w through the encoder E3 and the quantizer q. AE is performed and a bitstream w3e is generated based on the feature value map FM3w and entropy based on the feature value map FM3w (a value obtained by inputting the feature value map FM3w to the entropy estimator H3). Note that the difference dataset w3c is a difference between the multidimensional dataset w3a and a multidimensional dataset w3b. The multidimensional dataset w3b is a dataset obtained by up-sampling a sum of the multidimensional dataset w2b and a multidimensional dataset w2d for the scale 3. The multidimensional dataset w2d is a dataset output from the decoder D2 by inputting FM2w to the decoder D2.

In S706, the bitstreams w1c, w2e, and w2d are written in the physical space 60E as an encoded dataset of the multidimensional dataset w3a. In S708, physical address information corresponding to a write destination range is associated with the logical address information specified for the write request.

Figure 9:
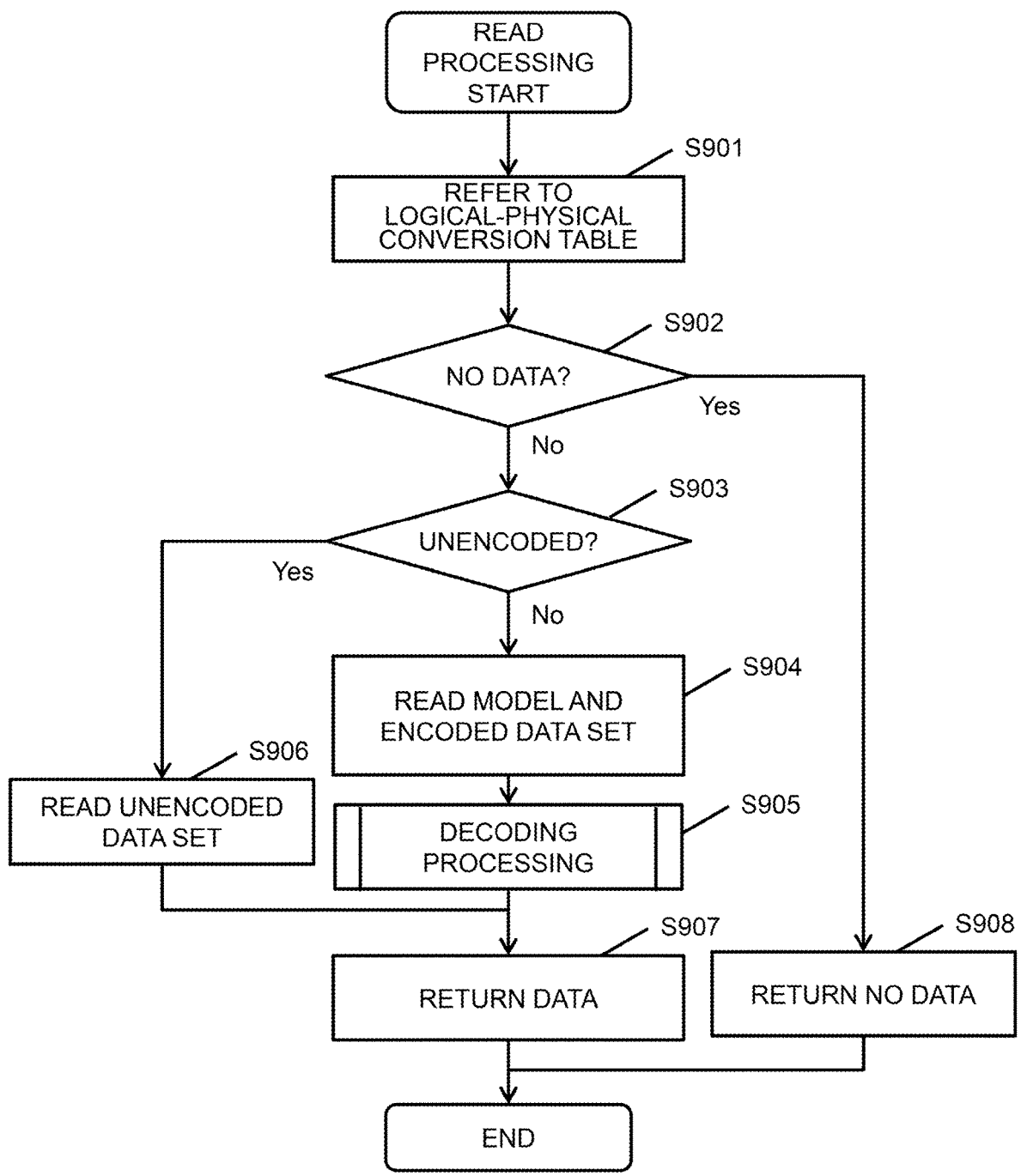
FIG. 9 shows a flow of read processing.

FIG. 9 shows a flow of the read processing.

The read processing is performed when the controller 71E receives a read request. Logical address information of a read target multidimensional dataset conforming to the read request may be designated by the read request or may be specified from address information designated by the read request. The entire logical address information or address information does not always have to be designated by the read request. For example, when a virtual space ID is specified, the logical address information of the read target multidimensional dataset may be logical address information of a multidimensional dataset recently written in the virtual space 61E identified from the virtual space ID. In the logical address information specified based on the read request, an address group for a dimension, an attribute of which is "discrete", may be designated by a Onehot vector.

The controller 71E refers to the logical-physical conversion table 200 using the specified logical address information as a key (S901) and determines whether data is present in a physical space portion (a part of the physical space 60E) corresponding to the logical address information, specifically, whether the record group 220 corresponding to the logical address information is present (S902). Note that, when at least a part of data (a model group or a dataset) corresponding to the logical address information is stored in a physical space 60C of the core system 103 instead of the physical space 60E, at least a part of the physical space portion corresponding to the logical address information may be a range represented by logical address information (logical address information of the virtual space 61C) corresponding to physical address information of the physical space 60C.

When a determination result in S902 is false (S902: No), the controller 71E returns no data as a response to the read request (S908).

When the determination result in S902 is true (S902: Yes), the controller 71E determines whether a dataset stored in a physical space portion corresponding to the logical address information is an unencoded dataset, specifically, whether the record 210P3 corresponding to the logical address information is valid (S903).

When a determination result in S903 is true (S903: Yes), the controller 71E reads an unencoded dataset from the physical space portion represented by the record 210P3 corresponding to the logical address information (S906) and returns the unencoded dataset as a response to the read request (S907).

When the determination result in S903 is false (S903: No), the controller 71E reads a model group and an encoded dataset from the physical space portions represented by the records 210P1 and 210P2 corresponding to the logical address information (S904). Decoding processing for decoding the encoded dataset is performed in the compressor 70E including the model group (S905). The controller 71E returns a dataset decoded in the decoding processing as a response to the read request (S907).

Figure 10:
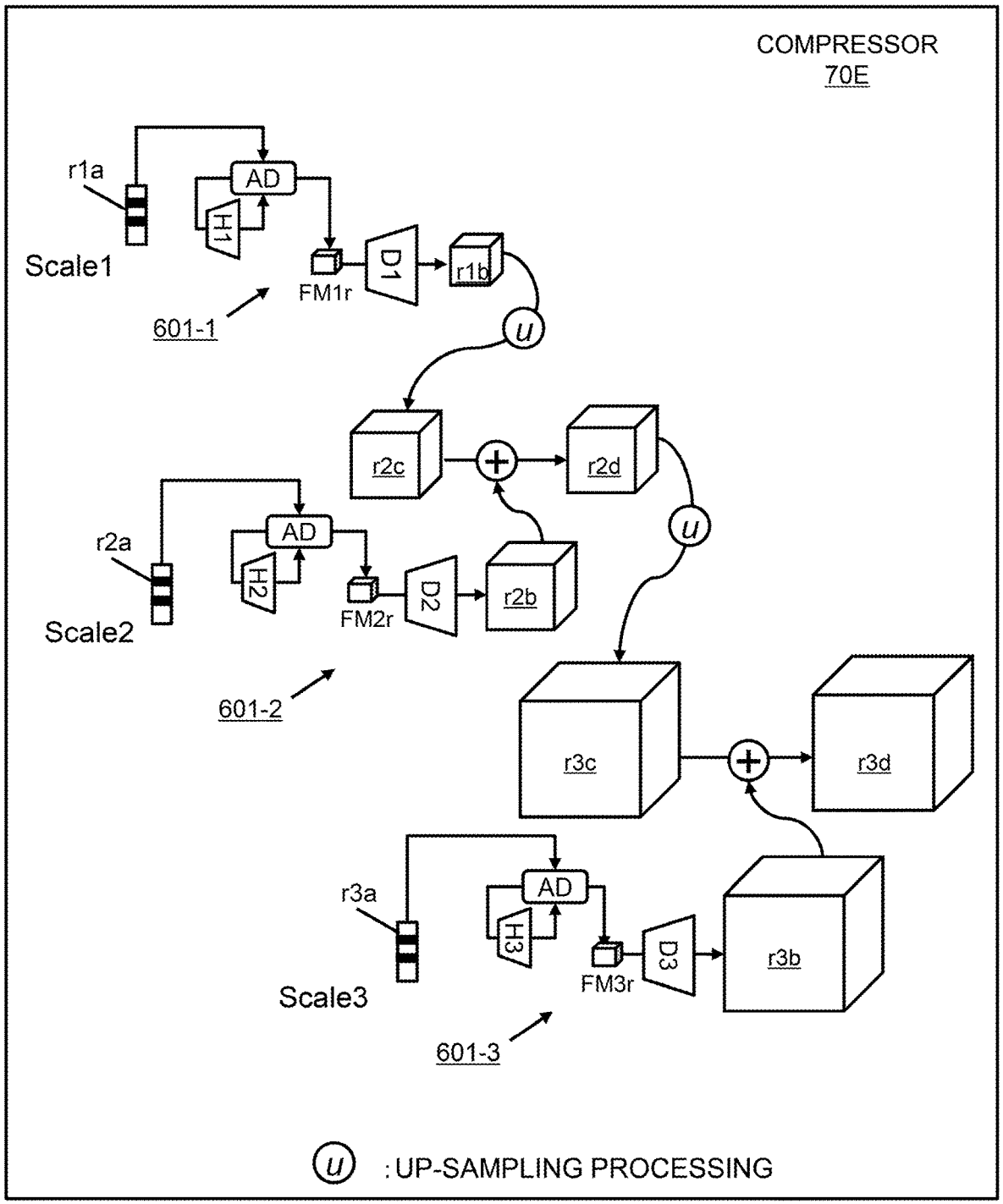
FIG. 10 shows an example of an overview of decoding processing.

FIG. 10 shows an example of an overview of the decoding processing (S905). Note that signs of elements for the scale n include n (n is any one natural number of 1 to 3) as in FIG. 6 and FIG. 8.

A scale is specified by the controller 71E from the logical address information specified for the read request. In this embodiment, the scale specified for the read request is equal to or smaller than a scale represented by logical address information registered in the logical-physical conversion table 200 for a read target multidimensional dataset. This is because a bitstream is absent for a scale larger than the scale represented by the logical address information. The decoding is performed for each of scales equal to or smaller than the specified scale. According to the example shown in FIG. 10, the specified scale is the scale 3. According to the example shown in FIG. 10, bitstreams present in a physical space portion represented by physical address information corresponding to logical address information specified for the read request are bitstreams r1a, r2a, and r3a. A flow of the decoding processing conforms to the configuration of the compressor 70E.

AD (decoding processing of arithmetic coding) is performed for the bitstream r1a. A part of a restoration target FM1r is restored from a part of FM1r restored by the AD from a part of the bitstream r1a, or information saved for other probability prediction, or a probability distribution obtained by inputting both of FM1r and the information to the entropy estimator H1 and a part of the restoration target bitstream r1a. FM1r is input to the decoder D1, whereby a multidimensional dataset r1b is obtained. The multidimensional dataset r1b is up-sampled for the scale 2, whereby a multidimensional dataset r2c is obtained.

AD is performed for the bitstream r2a. A part of a restoration target FM2r is restored from a part of FM2r restored by the AD from a part of the bitstream r2a, or information saved for other probability prediction, or a probability distribution obtained by inputting both of FM2r and the information to the entropy estimator H2 and a part of a restoration target bitstream r2a. FM2r is input to the decoder D2, whereby a difference dataset r2b is obtained. The difference dataset r2b is added to the multidimensional dataset r2c, whereby a multidimensional dataset r2d is obtained. The multidimensional dataset r2d is up-sampled for the scale 3, whereby a multidimensional dataset r3c is obtained.

AD is performed for the bitstream r3a. A part of a restoration target FM3r is restored from a part of FM3r restored by the AD from a part of the bitstream r3a, or information saved for other probability prediction, or a probability distribution obtained by inputting both of FM3r and the information to the entropy estimator H3 and a part of a restoration target bitstream r3a. FM3r is input to the decoder D3, whereby a difference dataset r3b is obtained. The difference dataset r3b is added to the multidimensional dataset r3c, whereby a multidimensional dataset r3d is obtained. The multidimensional dataset r3d is a multidimensional dataset in the scale 3, that is, a read target multidimensional dataset. The obtained multidimensional dataset in the scale 3 is returned as a response in S907.

Figure 11:
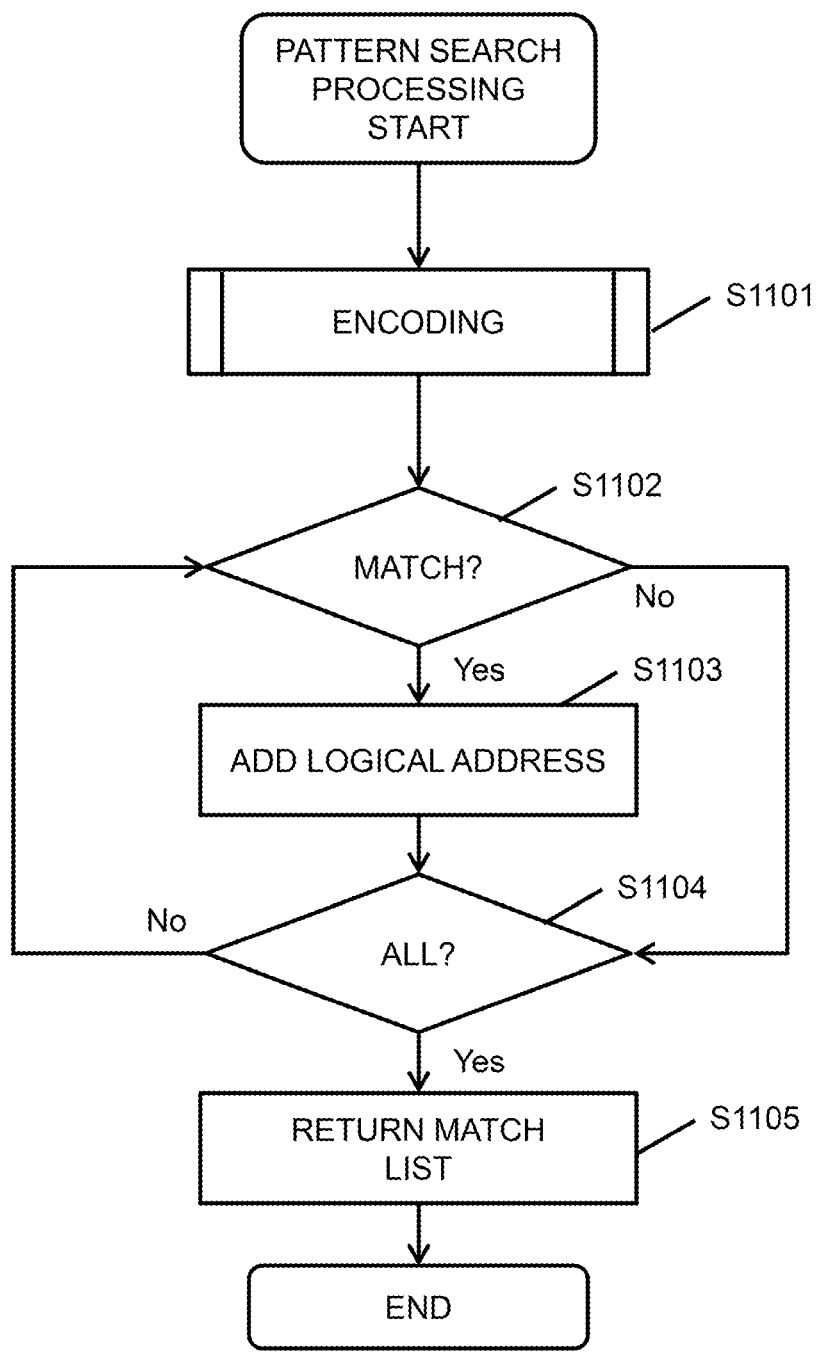
FIG. 11 shows a flow of pattern search processing.

FIG. 11 shows a flow of pattern search processing.

The pattern search processing is performed when the controller 71E receives a pattern search request having a search target data pattern. The following processing may be performed only for a virtual space ID designated by the pattern search request or may be performed for each of the virtual spaces 61E. One virtual space 61E is explained as an example below.

The controller 71E encodes the search target data pattern with the compressor 70E including a model group corresponding to the virtual space 61E (S1101). Consequently, an encoded dataset (a bitstream and/or a feature value map) of the search target data pattern is obtained for the scales.

The controller 71E determines whether an encoded dataset (for example, an encoded dataset, a difference of which from the obtained encoded dataset is zero or is within an allowable range) matching with the encoded dataset obtained in S1101 is present in an encoded dataset (for example, a bitstream and/or a feature value map for the scales) corresponding to an unchecked record 210L belonging to the virtual space 61E (S1102). The "unchecked record 210L" is the record 210L not referred to in S1102 in the pattern search processing.

When a determination result in S1102 is true (S1102: Yes), the controller 71E adds logical address information included in the unchecked record 210L to a match list (S1103). The "match list" is a list in which logical address information for which the determination result in S1102 is true is recorded and is a list transmitted as a response to the pattern search request.

When the determination result in S1102 is false (S1102: No) or after S1103, the controller 71E determines whether S1102 is performed for all records 210L belonging to the virtual space 61E (S1104). When a determination result of the determination in S1104 is false (S1104: No), S1102 is performed.

When the determination result in S1104 is true (S1104: Yes), the controller 71E returns the match list as a response to the pattern search request (S1105). At least one encoded dataset among matching encoded datasets may be returned as a response instead of or in addition to the match list. For example, when the number of matching records 210L is equal to or smaller than a predetermined number, the matching encoded datasets may be returned as a response instead of or in addition to the match list.

Second Embodiment

A second embodiment is explained. When the second embodiment is explained, differences from the first embodiment are mainly explained. Explanation is omitted or simplified about points common to the first embodiment.

Figure 12:
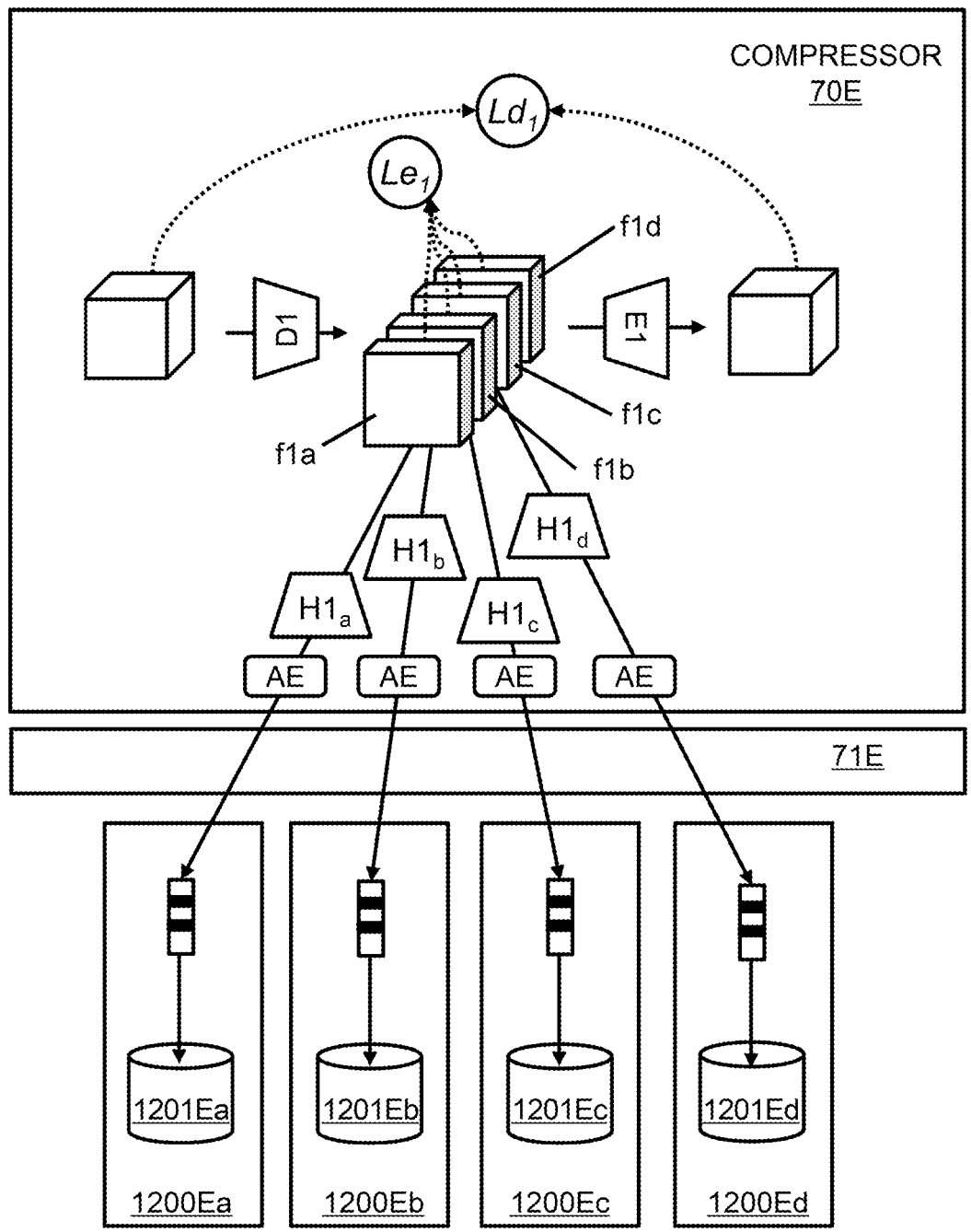
FIG. 12 shows an overview of a second embodiment.

FIG. 12 shows an overview of the second embodiment.

For example, the storage system 110E includes a plurality of nodes 1200E. The nodes 1200E are, for example, physical storage apparatuses or general-purpose computers. The nodes 1200E include permanent storage devices 1201E. The physical space 60E is based on a plurality of storage spaces provided by the plurality of nodes 1200E.

The scale 1 among a plurality of scales is representatively explained as an example. A multidimensional dataset for the scale 1 is converted into a feature value map through the encoder D1 (and the not-shown quantizer q). The compressor 70E (or the controller 71E) divides the feature value map in a channel direction. Consequently, a plurality of partial feature value maps f1 are obtained. In an example shown in FIG. 12, four partial feature value maps f1a to f1d are obtained. The number of partial feature value maps f1 may be equal to or smaller than the number of storage apparatuses (for example, nodes 1200 or permanent storage devices 1201) that can be a data storage destination. In other words, the compressor 70E (or the controller 71E) may divide the feature value map in the channel direction to make it unnecessary to store two or more partial feature value maps f1 in the same storage apparatus. Entropy estimators $H1_a$ to $H1_d$ respectively corresponding to the partial feature value maps f1a to f1d are prepared instead of the entropy estimator H1. Whereas the entropy estimator H1 performs estimation based on a dependency relation among the channels, the entropy estimators $H1_a$ to $H1_d$ are independent entropy estimators that perform estimation for channels corresponding to the entropy estimators and do not consider a dependency relation with the other channels.

In the network learning, the controller 71E performs, for each of the plurality of partial feature value maps f1, learning for setting the partial feature value map to zero at a predetermined probability and minimizing an error of the entire compressor 70E. For the partial feature value maps f1, the "predetermined probability" may be a probability common to the plurality of partial feature value maps f1 or may be an actual deficiency occurrence probability (an occurrence probability of deficiencies such as a failure and a delay) of storage apparatuses (the nodes 1200E or the permanent storage devices 1201E) at storage destinations of the partial feature value maps f1. $Le_1$ may be a total of four cross-entropies respectively corresponding to the entropy estimators $H1_a$ to $H1_d$. For each of the entropy estimators $H1_a$ to $H1_d$, the cross-entropy may be calculated by the entropy estimator based on an appearance probability of a symbol calculated based on the partial feature value map f1 corresponding to the entropy estimator, information saved for other probability prediction, or the like and an appearance probability of a symbol of a correct answer directly calculated from the partial feature value map f1.

In the write processing, for scales equal to or smaller than a scale specified for a write request, the controller 71E divides a feature value map of an input dataset for the scales (an original multidimensional dataset or a down-sampled multidimensional dataset) into four partial feature value maps (an example of a plurality of partial feature value maps) in the channel direction. The controller 71E generates four encoded datasets (for example, four bitstreams) based on the four partial feature value maps and the learned entropy estimators $H1_a$ to $H1_d$. The controller 71E writes the four encoded datasets respectively in different four nodes 1200Ea to 1200Ed. Storage apparatuses at storage destinations of the partial feature value maps may be different for each of the scales. For example, when four partial feature value maps are obtained for each of the three scales 1 to 3, twelve (=4×3) storage apparatuses may be necessary.

In the read processing, for example, it is assumed that a deficiency (for example, a failure or a delay) occurs in any one node 1200E (or the permanent storage device 1201E in the node 1200E) among the four nodes 1200Ea to 1200Ed and an encoded dataset (for example, a bitstream) cannot be read from the node 1200E within a fixed period after a read request is received. In this case, the controller 71E may set the partial feature value map corresponding to the node 1200E to zero and decode an encoded dataset in the scale 1 based on an encoded dataset read from each of the remaining three nodes 1200E.

According to the second embodiment, even if a deficiency occurs in any storage apparatus on which a physical space portion corresponding to logical address information specified for the read request is based, it is possible to decode a read target dataset. That is, it is possible to improve failure tolerance. Note that the second embodiment may be combined with a hierarchical data compression and decompression method with respect to the scales explained in the first embodiment.

Third Embodiment

A third embodiment is explained. When the third embodiment is explained, differences from the first and second embodiments are mainly explained. Explanation is omitted or simplified about points common to the first and second embodiments.

Figure 13:
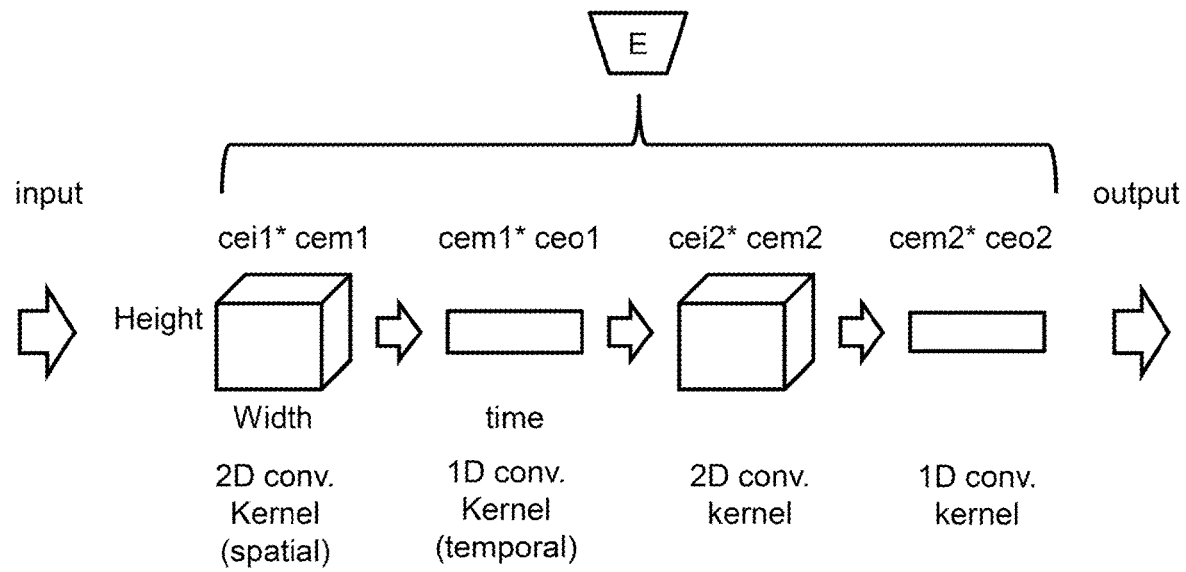
FIG. 13 shows a kernel configuration of an encoder according to a third embodiment.
Figure 14:
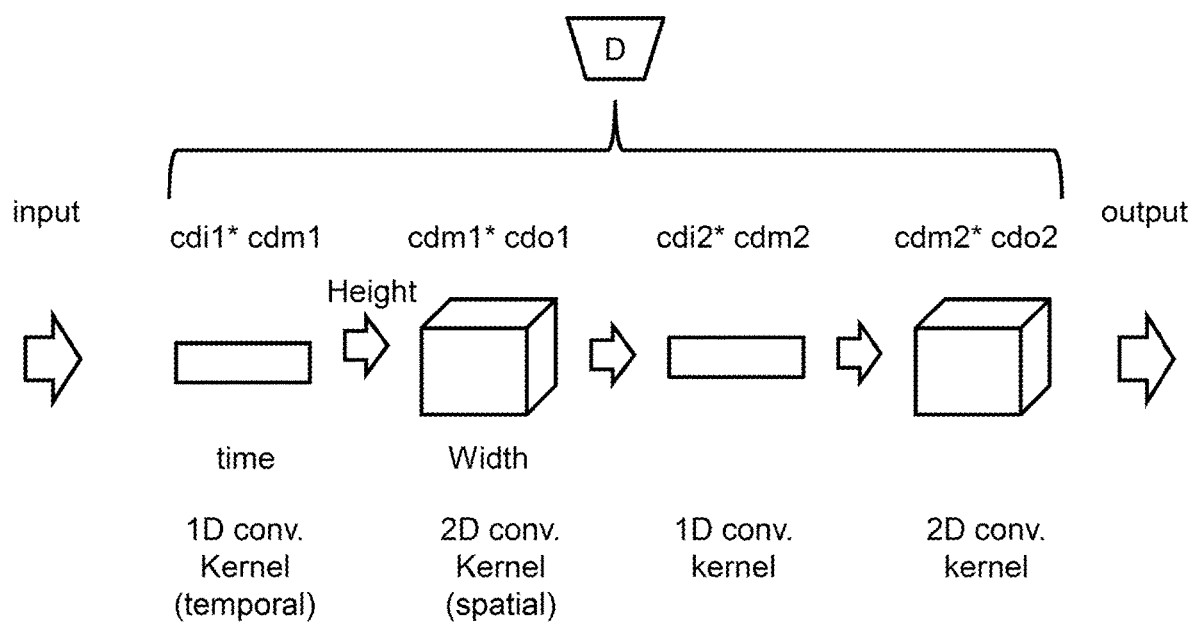
FIG. 14 shows a kernel configuration of a decoder according to the third embodiment.

FIG. 13 shows a kernel configuration of an encoder according to the third embodiment. FIG. 14 shows a kernel configuration of a decoder according to the third embodiment.

The controller 71E determines a plurality of data dimension groups based on the dimension setting table 300 (for example, based on a name and an attribute for each of dimensions). It may be determined, based on, for example, information representing a correlation among the dimensions and a history in the past, which data dimensions belong to the same group. As shown in FIG. 13 and FIG. 14, for at least one of an encoder and a decoder (for example, each of the encoder and the decoder), the controller 71E configures a plurality of kernels respectively corresponding to the determined plurality of data dimension groups. A plurality of convolution layers respectively corresponding to the plurality of kernels are sequential and the plurality of kernels are also sequential. Each of the plurality of data dimension groups is a group to which one or more data dimensions having a high correlation belong. That is, in the compressor generation processing, at a configuration time of kernels, the controller 71E forms kernels in a set of dimensions having a high correlation (for example, a set of dimensions, a correlation coefficient of which with any reference dimension is equal to or larger than a predetermined value) and links a formed plurality of kernels to one another. For example, as an example of the set of dimensions having a high correlation, there are "length" and "width". Both of "length" and "width" are considered to have a relatively low correlation with a dimension "time" and, therefore, "time" is considered to belong to a set different from a set to which "length" and "width" belongs.

In this way, each of the plurality of kernels corresponds to the set of dimensions having a high correlation and the plurality of kernels are linked together. Accordingly, for the kernels, since calculation considering dimensions having a low correlation is unnecessary, a calculation amount decreases (processing efficiency increases) and a compression ratio increases.

Note that, in FIG. 13 and FIG. 14, "e" means an encoder, "d" means a decoder, "i" means an input layer, "m" means an intermediate layer, and "o" means an output layer. The kernels being linked together means that, for each of the plurality of kernels, the number of output channels of the kernel is the same as the number of input channels of a kernel adjacent to the kernel on the downstream side (for example, ceo1=cei2). When the kernels linked together are configured for each of the encoder and the decoder, arrangement order of the kernels in the decoder is opposite to arrangement order of the kernels in the encoder.

Fourth Embodiment

A fourth embodiment is explained. When the fourth embodiment is explained, differences from the first to third embodiments are mainly explained. Explanation is omitted or simplified about points common to the first to third embodiments.

In the fourth embodiment, network learning includes super-resolution learning. Consequently, read processing for decoding a dataset in a scale larger than a scale of an encoded dataset is realized.

The super-resolution learning is, for example, at least one of first super-resolution learning and second super-resolution learning. The first super-resolution learning is learning for configuring the processing unit 601 corresponding to a scale larger than the scale 3 (an example of a scale of a multidimensional dataset input to the compressor 70E) and inputting a dataset up-sampled for the larger scale to the processing unit 601 corresponding to the larger scale.

Figure 15:
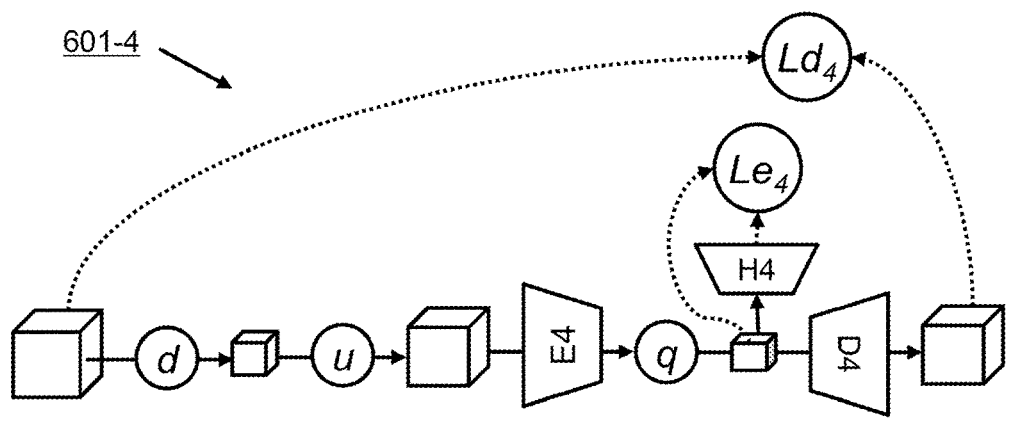
FIG. 15 shows an overview of first super-resolution learning according to a fourth embodiment.
Figure 16:
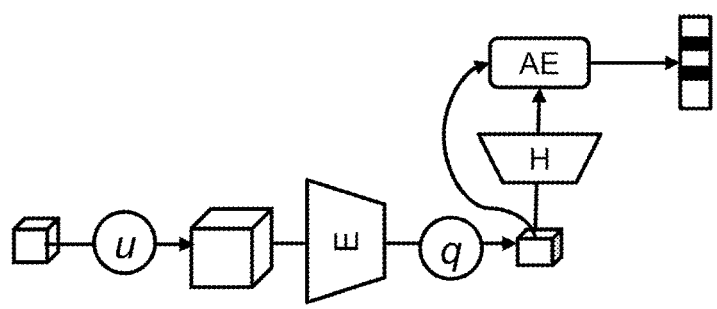
FIG. 16 shows an overview of encoding processing after the first super-resolution learning according to the fourth embodiment.
Figure 17:
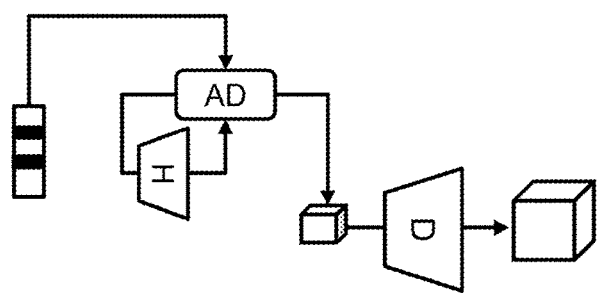
FIG. 17 shows an overview of decoding processing after the first super-resolution learning according to the fourth embodiment.

FIG. 15 shows an overview of the first super-resolution learning. FIG. 16 shows an overview of encoding processing after the first super-resolution learning. FIG. 17 shows an overview of decoding processing after the first super-resolution learning.

For example, in the dimension setting table 300 illustrated in FIG. 3, the size 314 may be a value based on the scale 3. However, the scale 315 may represent, besides the scales 1 to 3, one or more scales larger than the scale 3. When the scale larger than the scale 3 is designated by, for example, a user, a size corresponding to the designated scale may be determined based on a value represented by the size 314. For example, a size corresponding to a scale (n−3) (n is an integer larger than 3) may be $2^{(n-3)}$ times as large as the size corresponding to the scale 3. A scale 4 is explained as an example of the designated scale larger than the scale 3. According to FIG. 15, a processing unit 601-4 corresponding to the scale 4 is configured. In the network learning, after a multidimensional dataset (a multidimensional dataset in the scale 3) input to the compressor 70E is up-sampled for the scale 4, the multidimensional dataset is once down-sampled for the scale 3 and, thereafter, up-sampled for the scale 4 and then input to an encoder E4. Thereafter, as in the case of the scales 1 to 3, Le4 and Ld4 are obtained and learning for minimizing an error based on $Le_4$ and $Ld_4$ is performed. In this way, for the encoder E4, learning of encoding a dataset in the case in which the scale is enlarged from the scale 3 to the scale 4 is performed.

According to FIG. 16, when the scale 4 is designated for a write request, in encoding processing, a dataset in the scale 3 (for example, the dataset w3c shown in FIG. 8) is up-sampled to a dataset in the scale 4 and then input to the encoder E4. As a result, a bitstream of the dataset in the scale 4 is stored.

According to FIG. 17, in decoding processing, when the scale 4 is designated for a read request, a bitstream in the scale 4 only has to be decoded.

Figure 18:
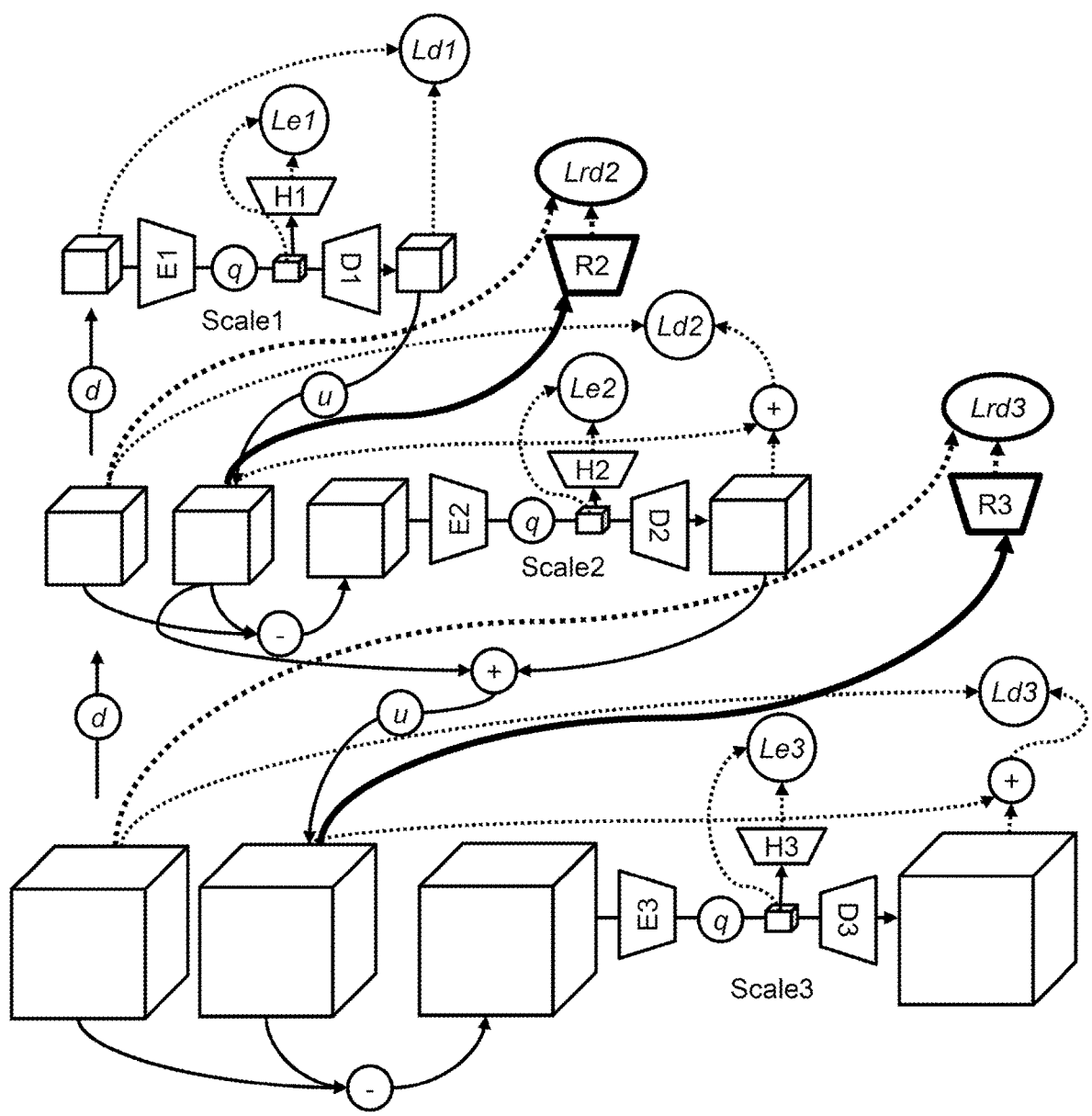
FIG. 18 shows an overview of second super-resolution learning according to the fourth embodiment.

FIG. 18 shows an overview of the second super-resolution learning.

The second super-resolution learning is learning for, for each of the scales 1 and 2 other than the scale 3, inputting data up-sampled for the scale to the processing unit 601 corresponding to the scale. A refine network (Ri) not requiring a data input at a read time in scales at a learning time is learned. That is, for each of the scales 2 and 3 other than the smallest scale 1, a refine network (for example, a convolutional neural network) of a dataset after up-sampling of a dataset obtained for a scale smaller than the scale by one stage is learned. Consequently, for example, even if a dataset in the scale 3 is absent, a dataset in the scale 3 can be generated from a dataset in the scale 2. In the network learning, for example, Math. 2 described below is adopted. A difference from Math. 1 is a term in the center. $Lrd_n$ may be a function representing a deterioration degree based on (x) and (y) described below.
(x) A dataset obtained by down-sampling, for the scale n, a dataset in the scale 3 input to the compressor 70E (or the dataset in the scale 3 input to the compressor 70E).
(y) A dataset obtained by up-sampling, for the scale n, a dataset output from a processing unit 601-(n−1) corresponding to the scale (n−1) (or a dataset obtained by up-sampling, for the scale n, a sum of the dataset output from the processing unit 601-(n−1) corresponding to the scale (n−1) and a dataset obtained by up-sampling, for the scale (n−1), a dataset output from a processing unit 601-(n−2) corresponding to a scale (n−2)).

$$L = \sum_{i=1}^{n} \lambda_{d_i} L_{d_i} + \sum_{i=2}^{n} \lambda_{rd_i} L_{rd_i} + \lambda_e \sum_{i=1}^{n} L_{e_i} \qquad \text{[Math. 2]}$$

Fifth Embodiment

A fifth embodiment is explained. When the fifth embodiment is explained, differences from the first to fourth embodiments are mainly explained. Explanation about points common to the first to fourth embodiments is omitted or simplified.

Instead of the loss function in the first to fourth embodiments, a function such as Math. 3 called "omni-directional loss function" for convenience in this embodiment is adopted. When compressed data is used in an application, an artifact having regularity such as block noise easily leads to erroneous determination of the application. In order to eliminate the erroneous determination, an artifact without regularity is obtained by learning neural networks of an encoder, a decoder, and the like as a minimax game to maximize entropy of a difference (an artifact) between input data and data after compression and decompression (an error is unpredictable and randomness is high) and minimize the artifact and a data size. For example, Math. 3 described below is adopted. Math. 3 may be applied for each of the scales.

$$\min_{E,D,H_f} \max_{H_d} L_d(x, D(q(E(x)))) + \qquad \text{[Math. 3]}$$
$$\lambda_f H_f(q(E(x))) - \lambda_d H_d(x - D(q(E(x))))$$

Figure 19:
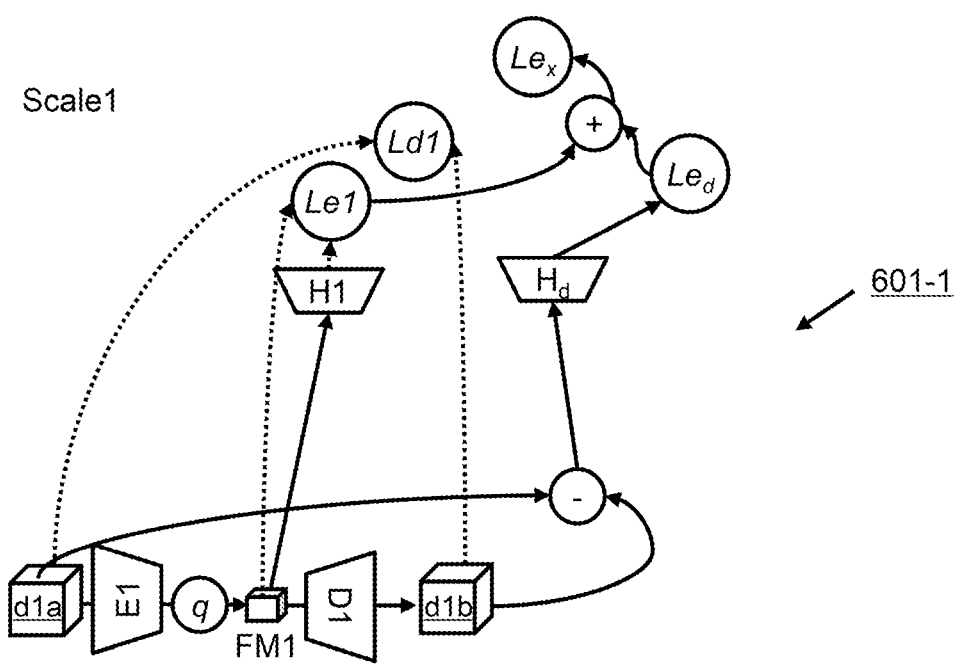
FIG. 19 shows an overview of a portion corresponding to a scale 1 in network learning according to a fifth embodiment.

E represents an encoder, D represents a decoder, and q represents a quantizer. $H_f$ represents an entropy estimator for a feature value map and $\lambda$ represents a Lagrange multiplier (a parameter for tradeoff adjustment). $H_d$ represents an entropy estimator for error data (an artifact) between an input multidimensional dataset (a multidimensional dataset in the scale 3) and D(E(x)) (a dataset after compression and decompression). $L_d$ represents an error indicator function (for example, PSNR, MSE, or MS-SSIM is used) as explained above and x represents an input multidimensional dataset. According to Math. 3, there is a new entropy estimator $H_d$ as illustrated in FIG. 19 (FIG. 19 shows the scale 1 as an example). A difference between the dataset d1$a$ input to the encoder E1 and the dataset d1$b$ output from the decoder D1 is input to the entropy estimator $H_d$ and omni-directionality $Le_d$ is calculated. The new entropy estimator $H_d$ (for example, a convolutional neural network) may receive, as an input, the difference between the dataset d1$a$ input to the encoder E1 and the dataset d1$b$ output from the decoder D1, output a probability distribution, and calculate omni-directionality according to, for example, cross-entropy with an omni-directional random probability distribution such as a Gaussian distribution. As the difference between d1$a$ and d1$b$ explained in this embodiment, not only a simple difference but also a difference of a result itself by some processing for other data configured by a differentiable model such as more advanced SSIM or a convolutional neural network may be used. $Le_x$ based on a sum of $Le_1$ and $Le_d$ is calculated. $Le_x$ is equivalent to $\lambda_f H_f(q(E(x)))$ of Math. 3. "$\lambda_d H_d(x-D(q(E(x))))$" means that a distance for a predetermined indicator is calculated based on an input and an output (for example, based on a difference between the input and the output). Subtracting "$\lambda_d H_d(x-D(q(E(x))))$" from "Ld(x, D(q(E(x)))+$\lambda_f H_f(q(E(x))))$" means learning for making regularity of deterioration omni-directional (in other words, making an error unpredictable, that is, maximizing entropy). According to Math. 3, E, D, and $H_f$ are learned to minimize a loss function. Thereafter, $H_d$ is learned to maximize the loss function. Math. 3 can be applied to tensor compression (for example, image compression) in general.

The several embodiments are explained above. However, the embodiments are illustrations for explanation of the present invention and are not meant to limit the scope of the present invention only to the embodiments. The present invention can be executed in other various forms.

REFERENCE SIGN LIST

110: Storage system

The invention claimed is:
1. A storage system comprising:
a storage apparatus;
a memory; and
a processor that controls data input and output, wherein
the memory stores dimension setting information, which is information representing an attribute for each of data dimensions of a multidimensional dataset,
the processor performs compressor generation processing, which is processing for generating a compressor based on the dimension setting information,
the processor performs write processing,
the write processing is processing for compressing a write target multidimensional dataset using the generated compressor and writing compressed data in the storage apparatus,
the attribute for each of the data dimensions is continuation, such that values belonging to a dimension are continuous values, or discrete, such that the values belonging to the dimension are discrete values,
the compressor includes a processing unit,
the processing unit includes, among an encoder that encodes an input dataset, a decoder that decodes a dataset based on a feature value map generated by quantizing data output from the encoder, and an entropy estimator that estimates entropy based on the feature value map, at least the entropy estimator, and
the compressor generation processing includes configuring the processing unit based on the attribute for each of the data dimensions represented by the dimension setting information.

2. The storage system according to claim 1, wherein
the dimension setting information further represents a data size for each of the data dimensions,
a model of the entropy estimator in the processing unit is a convolutional neural network,
when the processing unit includes the encoder and the decoder, a model of each of the encoder and the decoder is the convolutional neural network,
the compressor generation processing includes determining a number of channels and a number of kernel dimensions,
if there is one or more data dimensions, attributes of which are discrete, the processor determines the number of channels based on a data size for each of the one or more data dimensions, and
if there are data dimensions, attributes of which are continuous, the processor determines the number of kernel dimensions based on a number of the data dimensions, the attributes of which are continuous.

3. The storage system according to claim 2, wherein
the processor determines a plurality of data dimension groups based on the dimension setting information,
for at least one of the encoder and the decoder, the processor configures a plurality of kernels respectively corresponding to the determined plurality of data dimension groups and makes a plurality of convolution layers respectively corresponding to the plurality of kernels sequential, and
each of the plurality of data dimension groups is a group to which one or more data dimensions having a high correlation belong.

4. The storage system according to claim 1, wherein the compressor generation processing includes configuring the processing unit for each of a plurality of scales that the multidimensional dataset can take.

5. The storage system according to claim 4, wherein
an input dataset corresponding to a smallest scale among the plurality of scales is a dataset after an input multidimensional dataset is down-sampled for the smallest scale, and
for each of one or more scales other than the smallest scale among the plurality of scales, an input dataset corresponding to the scale is a dataset that is a difference between a dataset obtained by down-sampling, for the scale, the input multidimensional dataset and a dataset obtained by up-sampling, for the scale, a dataset output from the decoder corresponding to a scale smaller than the scale by one stage.

6. The storage system according to claim 1, wherein the compressor generation processing includes network learning, which is learning of the processing unit and is learning for minimizing an error.

7. The storage system according to claim 6, wherein
the compressor generation processing includes configuring the processing unit for each of a plurality of scales that the multidimensional dataset can take, the network learning is learning of the processing unit for each of the scales and is learning for minimizing an overall error including errors for each of the scales as elements, for the scales, the errors are obtained from a function concerning an input multidimensional dataset and based on a deterioration degree and a bit rate, for the scales, the deterioration degree is based on a difference between an input dataset for the scales and an output dataset obtained through the encoder and the decoder corresponding to the scales of the input dataset, and for the scales, the bit rate is based on a difference between a feature value map obtained for the scales and entropy calculated based on the feature value map by the entropy estimator corresponding to the scales.

8. The storage system according to claim 6, wherein in the network learning, the processor divides the feature value map into a plurality of partial feature value maps in a channel direction and, for each of the plurality of partial feature value maps, performs learning for setting the partial feature value map to zero at a predetermined probability and minimizing the error, in the write processing, the processor divides a feature value map of an input dataset based on the write target multidimensional dataset into a plurality of feature value maps in the channel direction and writes a plurality of encoded datasets respectively corresponding to the plurality of partial feature value maps respectively in a plurality of storage apparatuses, and in read processing, when there is a storage apparatus having a failure among the plurality of storage apparatuses, the processor reads one or more encoded datasets respectively from one or more storage apparatuses other than the storage apparatus and returns a dataset based on a dataset obtained by subjecting each of the read one or more encoded datasets to decoding processing.

9. The storage system according to claim 6, wherein the compressor generation processing includes configuring the processing unit for each of a plurality of scales that the multidimensional dataset can take, the network learning is learning of processing units for each of the scales and is learning for minimizing an overall error including errors for each of the scales as elements, the network learning includes super-resolution learning, and the super-resolution learning is at least one of learning for inputting a dataset up-sampled for a scale larger than a scale of the multidimensional dataset input to the compressor to a processing unit corresponding to the larger scale and learning for, for each of one or more scales other than the scale of the multidimensional dataset input to the compressor, inputting data up-sampled for the scale to a processing unit corresponding to the scale.

10. The storage system according to claim 6, wherein the processing unit includes another entropy estimator that estimates entropy of a difference between a dataset input to the encoder and a dataset output from the decoder, and the network learning includes learning the encoder, the decoder, and the entropy estimator to minimize a loss function and learning another entropy estimator to maximize the loss function.

11. The storage system according to claim 1, wherein the write processing is performed when the processor receives a write request, the write request is a request for writing of the write target multidimensional dataset and is a request designating a scale and addresses for each of the data dimensions of the multidimensional dataset, and the write processing includes:
  for each of one or more scales smaller than a largest scale among a plurality of scales, down-sampling the write target multidimensional dataset for the scale;
  for the scale designated by the write request, writing an encoded dataset, which is data obtained by subjecting, to encoding processing, a feature value map obtained for the scale concerning the write target multidimensional dataset and entropy calculated by the entropy estimator corresponding to the scale based on the feature value map; and
  generating logical-physical information representing correlation of the scale and the addresses for each of the data dimensions designated by the write request and a physical address of a storage area at a write destination of the encoded dataset.

12. The storage system according to claim 11, wherein the processor performs read processing when receiving a read request, the read request is a request for reading of a read target multidimensional dataset and is a request designating a scale and addresses for each of the data dimensions of the multidimensional dataset, and the read processing includes:
  specifying, based on the logical-physical information, a physical address corresponding to the scale and the addresses for each of the data dimensions designated by the read request;
  reading the encoded dataset from a storage area represented by the specified physical address; and
  returning a multidimensional dataset in the scale designated by the read request, the multidimensional dataset conforming to a dataset obtained by subjecting the read encoded data to decoding processing.

13. The storage system according to claim 11, wherein the processor performs pattern search processing when receiving a pattern search request correlated with a feature value map of a data pattern, and the pattern search processing includes:
  finding, from the storage apparatus, an encoded dataset having a pattern matching with a pattern of an encoded dataset obtained by subjecting the feature value map correlated with the pattern search request to encoding processing; and
  returning a scale and addresses for each of the data dimensions correlated with a physical address of a found encoded dataset.

14. A storage system comprising:

a storage apparatus;

a memory; and a processor that controls data input and output, wherein the memory stores dimension setting information, which is information representing an attribute for each of data dimensions of a multidimensional dataset, the processor performs compressor generation processing, which is processing for generating a compressor based on the dimension setting information, the processor performs write processing, the write processing is processing for compressing a write target multidimensional dataset using the generated compressor and writing compressed data in the storage apparatus, and the processor analyzes statistics of an input multidimensional dataset, specifies a number of data dimensions and an attribute for each of the data dimensions based on a result of analysis, and creates or updates the dimension setting information based on the specified number of data dimensions and the specified attribute for each of the data dimensions.

15. A non-transitory computer-readable storage medium encoded with a computer program including instructions for a method comprising:

referring to dimension setting information, which is information representing an attribute for each of data dimensions of a multidimensional dataset; and generating a compressor based on the information representing the attribute for each of the data dimensions represented by the dimension setting information; and compressing a write target multidimensional dataset using the generated compressor and writing compressed data in a storage apparatus, wherein the attribute for each of the data dimensions is continuation, such that values belonging to the dimension are continuous values, or discrete, such that the values belonging to a dimension are discrete values, wherein the compressor includes a processing unit, wherein the processing unit includes, among an encoder that encodes an input dataset, a decoder that decodes a dataset based on a feature value map generated by quantizing data output from the encoder, and an entropy estimator that estimates entropy based on the feature value map, at least the entropy estimator, and wherein the compressor generation processing includes configuring the processing unit based on the attribute for each of the data dimensions represented by the dimension setting information.

16. The non-transitory computer-readable storage medium according to claim 15, wherein the dimension setting information further represents a data size for each of the data dimensions, wherein a model of the entropy estimator in the processing unit is a convolutional neural network, wherein, when the processing unit includes the encoder and the decoder, a model of each of the encoder and the decoder is the convolutional neural network, and wherein the generating the compressor includes determining a number of channels and a number of kernel dimensions.

17. The non-transitory computer-readable storage medium according to claim 15, wherein the generating the compressor includes configuring the processing unit for each of a plurality of scales that the multidimensional dataset can take.

18. The non-transitory computer-readable storage medium according to claim 15, wherein the generating the compressor includes network learning, which is learning of the processing unit and is learning for minimizing an error.

* * * * *